(12) United States Patent
Mitsumori

(10) Patent No.: US 7,297,413 B2
(45) Date of Patent: Nov. 20, 2007

(54) PLATING SUBSTRATE, ELECTROLESS PLATING METHOD, AND CIRCUIT FORMING METHOD USING THE SAME

(75) Inventor: Kenichi Mitsumori, Miyagi-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 0 days.

(21) Appl. No.: 11/251,349

(22) Filed: Oct. 14, 2005

(65) Prior Publication Data

US 2006/0088705 A1    Apr. 27, 2006

(30) Foreign Application Priority Data

Oct. 21, 2004  (JP)  ............................ 2004-306481
Oct. 29, 2004  (JP)  ............................ 2004-315913
Aug. 29, 2005  (JP)  ............................ 2005-247658

(51) Int. Cl.
*B32B 15/04*    (2006.01)
*B32B 15/20*    (2006.01)

(52) U.S. Cl. .................. 428/674; 428/630; 428/632

(58) Field of Classification Search ............... 428/630, 428/628, 629, 632, 646, 670, 674, 936, 432, 428/434

See application file for complete search history.

(56) References Cited

U.S. PATENT DOCUMENTS 4,008,343 A *  2/1977  Cohen et al. ............... 205/126
4,167,601 A *  9/1979  Beckenbaugh et al. ..... 428/209
4,525,390 A *  6/1985  Alpaugh et al. ............ 427/305
4,604,299 A *  8/1986  De Luca et al. ........... 427/98.5
5,250,105 A * 10/1993  Gomes et al. .............. 106/1.11
6,743,479 B2*  6/2004  Kanoh et al. ............... 427/305

FOREIGN PATENT DOCUMENTS

JP   2000-054153    *  2/2000
JP   2004-332023       11/2004

* cited by examiner

*Primary Examiner*—Michael E. Lavilla
(74) *Attorney, Agent, or Firm*—Beyer Weaver LLP

(57) ABSTRACT

An electroless copper plating method is provided having a first catalyst step of forming a first catalyst layer on a ceramic base material containing a glass component using a tin chloride solution and a palladium chloride solution; a pre-copper-plating heat treatment step of heating the ceramic base material in an atmosphere containing oxygen; a laminate catalyst treatment step of forming a laminate catalyst layer on the ceramic base material using a tin chloride solution and a palladium chloride solution; a plating treatment step of forming a copper plating film on the ceramic base material using a copper plating solution containing a small amount of nickel ions; and a post-copper-plating heat treatment step of heating the ceramic base material at a heat treatment temperature not more than the glass transition temperature thereof.

1 Claim, 7 Drawing Sheets

PLATING SUBSTRATE, ELECTROLESS PLATING METHOD, AND CIRCUIT FORMING METHOD USING THE SAME

BACKGROUND OF THE INVENTION

1. Field of the Invention

The present invention relates to a plating substrate composed of a copper plating film provided on a glass base material or a ceramic base material, having at least an oxide on a surface thereof, an electroless plating method forming a copper plating film, and a circuit forming method using the aforementioned method.

2. Description of the Related Art

Heretofore, for example, as a method for forming a plating film on a glass base material or a ceramic base material, an electroless copper plating method has been known (for example, see Japanese Unexamined Patent Application Publication Nos. 2000-54153, 2003-13247, and 2004-332023).

In a related electroless copper plating method, in order to ensure high adhesion between a surface of a base material and a copper plating film formed thereon by an anchor effect, first, the surface is intensively processed by surface roughening treatment, so that coarse irregularities are formed on the surface.

Subsequently, a ceramic base material processed by the roughening treatment is immersed in a copper plating solution, so that a copper plating film is formed on the ceramic base material.

However, when the copper plating film, which is provided on the surface of the ceramic base material processed by the roughening treatment, is used as an electrode of a dielectric resonator or the like, an electrode having a wiring pattern with a pitch of approximately 100 μm may be formed; however, it becomes difficult to form an electrode having a wiring patter with a pitch of approximately 20 μm, and as a result, there has been a limit to form an electrode having a fine pitch wiring pattern.

In addition, in the dielectric resonator as described above, the Q is decreased in a non-load state, and as a result, high frequency properties are disadvantageously degraded.

Furthermore, the problem described above becomes more serious when coarser irregularities are formed on the surface by surface roughening treatment. Accordingly, as disclosed in Japanese Unexamined Patent Application Publication No. 2000-54153, for example, an electroless copper plating method has been proposed in which even when the irregularities are formed on the surface as fine as possible by roughening treatment, excellent adhesion of a copper plating film to the surface thus processed is ensured.

In the electroless copper plating method as described above, after fine irregularities are formed on the surface of a ceramic base material by roughening treatment, a copper plating film is formed by immersing the ceramic base material processed by the roughening treatment in a copper plating solution. In this case, according to the electroless copper plating method disclosed in Japanese Unexamined Patent Application Publication No. 2000-54153, in order to increase the adhesion of the copper plating film to the surface on which the fine irregularities are formed, 0.01 to 1.0 mole of nickel ions is contained in a copper plating solution with relative to 100 moles of copper contained therein. As described above, even when the irregularities formed on the surface are fine, the copper plating solution is prepared so as to ensure high adhesion of the copper plating film to the surface thus processed.

As described above, according to Japanese Unexamined Patent Application Publication No. 2000-54153, even when the irregularities formed on the surface are fine, the copper plating film can be favorably adhered to the surface; however, even by the electroless copper plating method described above, it is required that the roughening treatment be performed on the surface of the ceramic base on which the plating is to be performed. However, in order to form a fine pitch wiring pattern and to further improve the high frequency properties, it has been desired that the surface of the base material be mirror finished.

In addition, since hydrogen fluoride is used in one step of the roughening treatment, waste disposal treatment is also required, the number of production steps is increased, and as a result, the production cost is disadvantageously increased. Hence, in view of environmental conservation and reduction in production cost, it is preferable that the roughening treatment be not performed.

However, when a copper plating film is formed on a mirror-finished surface of the ceramic base material, a problem may arise in that the adhesion of the copper plating film to the surface is considerably decreased.

SUMMARY OF THE INVENTION

Accordingly, the present invention was made in consideration of the problems described above, and it is an object of the present invention to provide a plating substrate, an electroless plating method, and a circuit forming method using the aforementioned method. In the plating substrate described above, a copper plating film can be favorably adhered to a mirror-finished surface of a base material so as to form a fine pitch wiring pattern, and hence a circuit having superior high frequency properties can be formed.

To the end, the present invention provides a plating substrate comprising: a glass base material or a ceramic base material, which has at least an oxide on a surface thereof; a copper plating film formed using a copper plating solution containing at least one of nickel ions, cobalt ions, and iron ions at a low concentration; and an interlayer provided between the base material and the copper plating film. In the plating substrate described above, the interlayer includes a base material component of the base material, a plating film component of the copper plating film, and a catalyst component of a catalyst layer which is formed using a tin chloride solution and a palladium chloride solution.

The present invention provides another plating substrate comprising: a glass base material or a ceramic base material, which has at least an oxide on a surface thereof; a copper plating film formed using a copper plating solution containing at least one of nickel ions, cobalt ions, and iron ions at a low concentration; and an interlayer provided between the base material and the copper plating film. In the plating substrate described above, the interlayer includes a base material component of the base material, a plating film component of the copper plating film, and a catalyst component of a catalyst layer which is formed using a tin-palladium colloidal solution.

According to the plating substrates described above, since the interlayer is formed of the base material component of the base material, the plating film component of the copper plating film, and the catalyst component of the catalyst layer, the catalyst layer can be favorably adhered to the base material by the presence of this interlayer. In particular, when heat treatment is performed in an oxygen atmosphere before the copper plating film is formed, the tin can be more reliably bonded to the oxygen which is a component of the base material. In addition, when heat treatment is performed before and after the copper plating film is formed, the tin and the palladium form metal bonds, and in addition, by the presence of the nickel ions, cobalt ions, or iron ions in the copper plating solution, excellent adhesion between the catalyst layer and the copper plating film can be ensured.

The present invention provides an electroless copper plating method which comprises: a catalyst treatment step of forming a catalyst layer on a glass base material or a ceramic base material, which has at least an oxide on a surface thereof, using a tin chloride solution and a palladium chloride solution; a pre-copper-plating heat treatment step of heating the base material in an atmosphere containing oxygen after the catalyst treatment step; a plating treatment step of forming a copper plating film after the pre-copper-plating heat treatment step, using a copper plating solution containing at least one of nickel ions, cobalt ions, and iron ions at a low concentration; and a post-copper-plating heat treatment step of heating the base material at a temperature not more than the glass transition temperature thereof in an atmosphere substantially containing no oxygen and hydrogen after the plating treatment step.

In addition, the present invention provides another electroless plating method which comprises: a catalyst treatment step of forming a catalyst layer on a glass base material or a ceramic base material, which has at least an oxide on a surface thereof, using a tin-palladium colloidal solution; a pre-copper-plating heat treatment step of heating the base material in an atmosphere containing oxygen after the catalyst treatment step; a plating treatment step of forming a copper plating film after the pre-copper-plating heat treatment step, using a copper plating solution containing at least one of nickel ions, cobalt ions, and iron ions at a low concentration; and a post-copper-plating heat treatment step of heating the base material at a temperature not more than the glass transition temperature thereof in an atmosphere substantially containing no oxygen and hydrogen after the plating treatment step.

According to the electroless plating methods described above, since tin (Sn) and palladium (Pd) are present in the catalyst layer formed on the glass base material or the ceramic base material, which has at least an oxide on the surface thereof, and the pre-copper-plating heat treatment and the post-copper-plating heat treatment are performed, the tin is bonded to the oxide, which is a component of the base material, at the interface between the base material and the catalyst layer, and the catalyst layer can be favorably adhered to the base material. In particular, in the pre-copper-plating heat treatment step, since heat treatment is performed in an oxygen atmosphere, the tin can be more reliably bonded to the oxygen which is a component of the base material. In addition, since the pre-copper-plating heat treatment and the post-copper-plating heat treatment are performed, the tin and the palladium form metal bonds, and in addition, by the presence of the nickel ions, cobalt ions, or iron ions in the copper plating solution, excellent adhesion between the catalyst layer and the copper plating film can be ensured.

In addition, when Ag-based vias are formed in the ceramic base material, tin and palladium are present on the Ag-based vias, and the palladium and the Ag are tightly bonded to each other by the pre-copper-plating heat treatment and the post-copper-plating heat treatment; hence, the Ag layer of the via and the catalyst layer can be favorably adhered to each other.

In addition, in another electroless copper plating method according to the present invention, the catalyst treatment step described above is a first catalyst treatment step of forming a first catalyst layer, and there is provided a laminate catalyst treatment step of forming a laminate catalyst layer on the base material using a tin chloride solution and a palladium chloride solution or using a tin-palladium colloidal solution after the pre-copper-plating heat treatment and before the post-copper-plating heat treatment.

According to this electroless plating method, since the laminate catalyst layer is formed by performing the laminate catalyst treatment step after the pre-copper-plating heat treatment step, the rate of formation of the copper plating film in the first plating treatment step can be increased.

Another electroless plating method according to the present invention is an electroless plating method for the base material having Ag-based vias formed therein, and the heat treatment temperature in the pre-copper-plating heat treatment is not less than the decomposition temperature of a silver oxide. In addition, there is provided an oxide film removing step of removing an oxide film formed on the surfaces of the vias after the pre-copper-plating heat treatment and before the plating treatment step.

According to another electroless plating method of the present invention, in the oxide film removing step described above, one of purified water, an aqueous $H_2O_2$ solution, hot purified water, ammonia water, and diluted nitric acid is used.

According to another electroless plating method of the present invention, the laminate catalyst treatment step described above is performed after the oxide film removing step.

According to the above electroless plating methods of the present invention, in the Ag-based vias, the Ag layers are oxidized to form oxide layers when the temperature is decreased after the pre-copper-plating heat treatment step; however, in the oxide film removing step, the oxide films formed on the Ag layers can be removed. In addition, when the heat treatment temperature in the post-copper-plating heat treatment step is set to not less than the decomposition temperature of a silver oxide, the formation of the oxide films on the vias can be prevented.

In another electroless plating method according to the present invention, the amount of nickel ions is preferably 1 to 25 moles relative to 100 moles of copper ions contained in the copper plating solution.

According to another electroless plating method of the present invention, the heat treatment temperatures in the pre-copper-plating heat treatment step and the post-copper-plating heat treatment step are in the range of 250 to 450° C.

According to another electroless plating method of the present invention, the heat treatment time in the pre-copper-plating heat treatment step and the post-copper-plating heat treatment step is 10 minutes or more.

According to another electroless plating method of the present invention, the heat treatment in the post-copper-plating heat treatment step is performed while a predetermined pressure is being applied to the base material.

According to another electroless plating method of the present invention, the heat treatment temperature in the post-copper-plating heat treatment step in which a predetermined pressure is being applied to the base material is in the range of 150 to 400° C.

According to the electroless plating methods of the present invention described above, since the post-copper-plating heat treatment step is performed while a pressure is being applied to the base material, the plating film is conformally adhered to nanometer-order irregularities, and hence the adhesion of the copper plating film can be improved by further decreasing the heat treatment temperature in the post-copper-plating heat treatment step.

Furthermore, in another electroless plating method according to the present invention, the catalyst treatment step is a first catalyst treatment step of forming a first catalyst layer, and there are provided a second plating treatment step of forming a nickel plating film using a plating solution containing a nickel compound after the post-copper-plating heating step and, after the second plating treatment step, a post-nickel-plating heat treatment step of heating the base material in an atmosphere substantially containing no oxygen and hydrogen at a heating temperature at which the hardness of the nickel compound is not changed.

In another electroless plating method according to the present invention, there is provided a third plating treatment step of forming a gold plating film using a gold plating solution after the second plating treatment step and before the post-nickel-plating heating step.

According to another electroless plating method of the present invention, a heat treatment temperature in the post-nickel-plating heating step is in the range of 150 to 350° C.

According to another electroless plating method of the present invention, a heat treatment time in the post-nickel-plating heating step is in the range of 10 minutes to 12 hours.

It has been known that although the nickel plating film or the gold plating film is simply formed on the copper plating film, the copper plating film provided therewith is easily peeled away from the base material. The reason for this is believed that since hydrogen radicals penetrate the nickel plating film, the gold plating film, the copper plating film, and the interlayer during the second and the third plating treatment steps, and thereby the adhesion between the copper plating film and the base material is degraded. Hence, according to the electroless plating methods of the present invention, the post-nickel-plating heat treatment is performed after the second plating treatment step and the third plating treatment step are performed, and hence the adhesion between the base material and the copper plating film provided with the nickel plating film and the gold plating film can be improved. The reason for this is believed that by the post-nickel-plating heat treatment step, hydrogen radicals can be released from the nickel plating film, the gold plating film, the copper plating film, and the interlayer.

In accordance with the present invention, there is provided a circuit forming method comprising: a catalyst treatment step of forming a catalyst layer on a glass base material or a ceramic base material, which has at least an oxide on a surface thereof, using a tin chloride solution and a palladium chloride solution; a pre-copper-plating heat treatment step of heating the base material in an atmosphere containing oxygen after the catalyst treatment step; a plating treatment step of forming a copper plating film after the pre-copper-plating heat treatment step, using a copper plating solution containing at least one of nickel ions, cobalt ions, and iron ions at a low concentration; a post-copper-plating heat treatment step of heating the base material at a temperature not more than the glass transition temperature thereof in an atmosphere substantially containing no oxygen and hydrogen after the plating treatment step; and a patterning treatment step of performing pattern treatment for the catalyst layer or the plating film.

Another circuit forming method of the present invention comprises: a catalyst treatment step of forming a catalyst layer on a glass base material or a ceramic base material, which has at least an oxide on a surface thereof, using a tin-palladium colloidal solution; a pre-copper-plating heat treatment step of heating the base material in an atmosphere containing oxygen after the catalyst treatment step; a plating treatment step of forming a copper plating film after the pre-copper-plating heat treatment step, using a copper plating solution containing at least one of nickel ions, cobalt ions, and iron ions at a low concentration; a post-copper-plating heat treatment step of heating the base material at a temperature not more than the glass transition temperature thereof in an atmosphere substantially containing no oxygen and hydrogen after the plating treatment step; and a patterning treatment step of performing pattern treatment for the catalyst layer or the plating film.

According to the above circuit forming methods using the electroless plating method of the present invention, the catalyst layer can be favorably adhered to the base material, and in addition to that, the catalyst layer and the copper plating film can also be favorably adhered to each other. Accordingly, on the mirror-finished base material, a circuit can be formed by the copper plating film. Hence, a fine pitch wiring pattern can be formed on the base material, and in addition to that, the high frequency properties of the circuit can be improved.

Another circuit forming method according to the present invention is a circuit forming method using the electroless plating method performed for the base material having Ag-based vias provided therein, in which a heat treatment temperature in the pre-copper-plating heat treatment is set to not less than the decomposition temperature of a silver oxide, and in which there is provided an oxide film removing step of removing oxide films formed on the surfaces of the vias after the pre-copper-plating heat treatment step and before the post-copper-plating heat treatment step.

In the circuit forming method of the present invention, although the Ag-based vias are oxidized to form oxide films when the temperature is decreased after the pre-copper-plating heat treatment, the oxide films formed on the vias can be removed in the oxide removing step. In addition, when the heat treatment temperature in the post-copper-plating heat treatment is set to not less than the decomposition temperature of a silver oxide, the formation of oxide films on the vias can be prevented.

In another circuit forming method according to the present invention, the copper plating treatment described above is a first plating treatment step, and there are provided a second plating treatment step of forming a nickel plating film using a plating solution containing a nickel compound after the post-copper-plating heat treatment and, after the second plating treatment step, a post-nickel-plating heat treatment step of heating the base material in an atmosphere substantially containing no oxygen and hydrogen at a temperature at which the hardness of the nickel compound is not changed.

In another circuit forming method according to the present invention, there is provided a third plating treatment step of forming a gold plating film using a gold plating solution after the second plating treatment step and before the post-nickel-plating heat treatment step.

According to the above circuit forming methods of the present invention, it is believed that since hydrogen radicals can be released from the nickel plating film, the gold plating film, the copper plating film, and the interlayer by performing the post-nickel-plating heat treatment after the second plating treatment step and the third plating treatment step are performed, the adhesion between the base material and the copper plating film provided with the nickel plating film and the gold plating film can be improved.

Another electroless plating method according to the present invention comprises: a catalyst treatment step of forming a catalyst layer on a glass base material using a tin chloride solution and a tin palladium solution; a plating treatment step of forming a plating film after the catalyst treatment step, using a copper plating solution containing at least one of nickel ions, cobalt ions, and iron ions at a low concentration; and a post-copper-plating heat treatment step of heating the glass base material in an atmosphere substantially containing no oxygen and hydrogen after the plating treatment step.

Another electroless plating method according to the present invention comprises: a catalyst treatment step of forming a catalyst layer on a glass base material using a tin-palladium colloidal solution; a plating treatment step of forming a plating film after the catalyst treatment step, using a copper plating solution containing at least one of nickel ions, cobalt ions, and iron ions at a low concentration; and a post-copper-plating heat treatment step of heating the glass base material in an atmosphere substantially containing no oxygen and hydrogen after the plating treatment step.

In another electroless plating method according to the present invention, the amount of nickel ions relative to 100 moles of copper ions contained in the copper plating solution is in the range of 1.0 to 25 moles.

In another plating method according to the present invention, the heat treatment temperature is in the range of 250 to 450° C.

In another electroless plating method according to the present invention, the heat treatment time is 10 minutes or more.

According to the electroless plating methods described above, since tin (Sn) and palladium (Pd) are present in the catalyst layer formed on the glass base material, and the tin is bonded to the oxygen in the glass at the interface between the glass base material and the catalyst layer by performing the post-copper-plating heat treatment, the catalyst layer is favorably adhered to the glass base material. In addition, by the post-copper-plating heat treatment, the tin and the palladium form metal bonds, and by the presence of the nickel ions in the copper plating solution, excellent adhesion between the catalyst layer and the plating film can be ensured; hence, the copper plating film can be tightly adhered to the glass base material.

In another electroless plating method of the present invention, the post-copper-plating heat treatment is performed while a predetermined pressure is being applied to the glass base material.

According to another electroless plating method of the present invention, in the post-copper-plating heat treatment which is performed while a predetermined pressure is being applied to the glass base material, the heat treatment temperature is set in the range of 150 to 400° C.

According to the above electroless plating methods of the present invention, since the post-copper-plating heat treatment is performed while a pressure is being applied to the base material, the plating film is conformably adhered to nanometer-order irregularities, and the adhesion of the copper plating film can be improved by further decreasing the heat treatment temperature in the post-copper-plating heat treatment.

Furthermore, in another electroless plating method according to the present invention, the catalyst treatment step is a first catalyst treatment step of forming a first catalyst layer, and there are provided a second plating treatment step of forming a nickel plating film using a plating solution containing a nickel compound after the post-copper-plating heating step and, after the second plating treatment step, a post-nickel-plating heating step of heating the glass base material in an atmosphere substantially containing no oxygen and hydrogen at a heating temperature at which the hardness of the nickel compound is not changed.

In another electroless plating method according to the present invention, there is provided a third plating treatment step of forming a gold plating film using a gold plating solution after the second plating treatment step and before the post-nickel-plating heating step.

In another electroless plating method according to the present invention, a heat treatment temperature in the post-nickel-plating heating step is in the range of 150 to 350° C.

In another electroless plating method according to the present invention, a heat treatment time in the post-nickel-plating heating step is in the range of 10 minutes to 12 hours.

It has been known that when the nickel plating film and the gold plating film are simply formed on the copper plating film, the copper plating film provided therewith is easily peeled away from the base material. The reason for this is believed that since hydrogen radicals penetrate the nickel plating film, the gold plating film, the copper plating film, and the interlayer during the second and the third plating treatment steps, the adhesion between the copper plating film and the base material is degraded. Hence, according to the electroless plating methods of the present invention, the post-nickel-plating heat treatment is performed after the second plating treatment step and the third plating treatment step are performed, and hence the adhesion between the base material and the copper plating film provided with the nickel plating film and the gold plating film can be improved. The reason for this is believed that by the post-nickel-plating heat treatment, hydrogen radicals can be released from the nickel plating film, the gold plating film, the copper plating film, and the interlayer.

Another circuit forming method according to the present invention comprises: a catalyst treatment step of forming a catalyst layer on a glass base material using a tin chloride solution and a palladium chloride solution; a patterning treatment step of patterning the catalyst layer; a plating treatment step of forming a plating film using a copper plating solution containing at least one of nickel ions, cobalt ions, and iron ions at a low concentration after the patterning treatment step; and after the plating treatment step, a heat treatment step of heating the base material in an atmosphere substantially containing no oxygen and hydrogen at a temperature no more than the glass transition temperature after the plating treatment step.

Another circuit forming method according to the present invention comprises: a catalyst treatment step of forming a catalyst layer on a glass base material using a tin-palladium colloidal solution; a patterning treatment step of patterning the catalyst layer; a plating treatment step of forming a plating film using a copper plating solution containing at least one of nickel ions, cobalt ions, and iron ions at a low concentration after the patterning treatment step; and after the plating treatment step, a heat treatment step of heating the base material in an atmosphere substantially containing no oxygen and hydrogen at a temperature no more than the glass transition temperature after the plating treatment step.

According to the above circuit forming methods of the present invention, since tin and palladium are present in the catalyst layer formed on the glass base material, and the tin is bonded to the oxygen in the glass at the interface between the glass base material and the catalyst layer by performing the heat treatment after the plating treatment, the adhesion of the catalyst layer to the glass base material is improved. In addition, by the heat treatment, the tin and the palladium form metal bonds, and by the presence of the nickel ions in the copper plating solution, excellent adhesion between the catalyst layer and the plating film can be ensured; hence, the copper plating film can be tightly adhered to the glass base material.

In another circuit forming method according to the present invention, the plating treatment step is a first plating treatment step of forming a copper plating film, and the heat treatment step is a post-copper-plating heat treatment. In addition, there are provided a second plating treatment step of forming a nickel plating film using a plating solution containing a nickel compound after the post-copper-plating heat treatment step, and after the second plating treatment step, a post-nickel-plating heat treatment step of heating the glass base material in an atmosphere substantially containing no oxygen and hydrogen at a temperature at which the hardness of the nickel compound is not changed.

In another circuit forming method of the present invention, there is provided a third plating treatment step of forming a gold plating film using a gold plating solution after the second plating treatment and before the post-nickel-plating heat treatment.

According to the circuit forming methods of the present invention, it is believed that since hydrogen radicals can be released from the nickel plating film, the gold plating film, the copper plating film, and the interlayer by performing the post-nickel-plating heat treatment after the second plating treatment step and the third plating treatment step are performed, the adhesion between the base material and the copper plating film provided with the nickel plating film and the gold plating film can be improved.

As has been described, according to the plating substrates and the electroless plating methods of the present invention, even when a glass base material or a ceramic base material, having at least an oxide on a surface thereof, has a mirror-finished surface, the copper plating film can be tightly adhered to the base material. Hence, when an electrode is formed using the copper plating film, a fine pitch wiring pattern can be formed. In addition, roughening treatment to form irregularities on the surface of the base material is not required, and hence various inconveniences caused by the roughening treatment can be avoided.

In addition, according to the circuit forming methods of the present invention, since the copper plating film can be favorably adhered to the mirror-finished base material, and hence a circuit can be formed on the mirror-finished base material from the copper plating film, a fine pitch wiring pattern can be formed from the copper plating film, and in addition, the high frequency properties of the circuit can be improved.

DESCRIPTION OF THE PREFERRED EMBODIMENTS

Hereinafter, referring to FIGS. 1 to 7E, embodiments of a plating substrate, an electroless plating method, and a circuit forming method using the same, according to the present invention, will be described.

Figure 1:
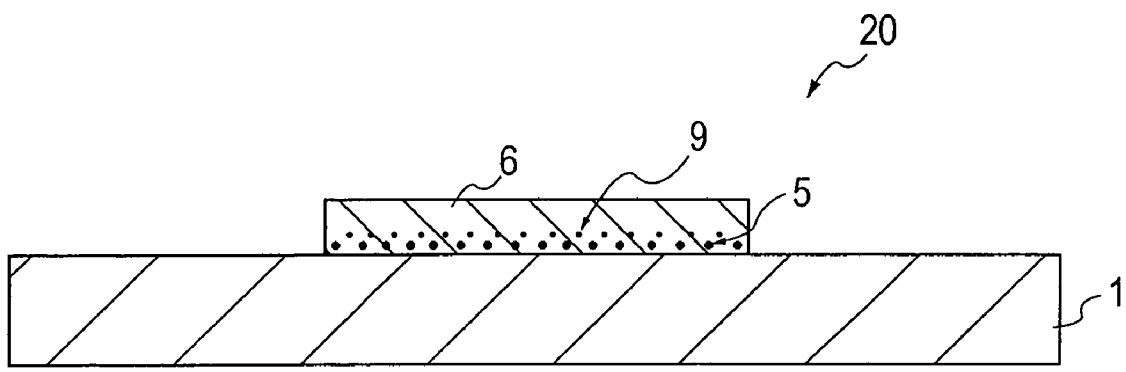
FIG. 1 is a schematic cross-sectional view of a plating substrate according to an embodiment of the present invention.

FIG. 1 is a schematic cross-sectional view of a plating substrate of this embodiment, and as shown in FIG. 1, a plating substrate 20 includes a ceramic base material 1 having a glass component on a surface thereof. On the surface of the ceramic base material 1, a copper plating film 6 is provided which is formed using a copper plating solution containing at least one of nickel ions, cobalt ions, and iron ions at a low concentration, and between the ceramic base material 1 and the copper plating film 6, an interlayer is provided which is composed of a base material component of the ceramic base material 1, a plating film component of the copper plating film 6, and catalyst components of a first catalyst layer 5 and a laminate catalyst layer 9, which are formed using a tin chloride solution and a palladium chloride solution.

In this embodiment, it is described that the base material of the plating substrate 20 is the ceramic base material 1 having a glass component; however, the base material is not limited thereto, and for example, various base materials such as glasses and ceramics containing oxides may also be used. For example, there may be mentioned base materials such as silicon oxides, aluminum oxides, and zirconium oxides; ceramic base materials containing oxides of silicon, aluminum, and the like; and glass base materials containing oxides of silicon, aluminum, and the like. Furthermore, base materials having oxides on surfaces thereof may also be used, and for example, there may be mentioned base materials such as single crystal silicon, silicon carbide, and silicon nitride, the topmost surfaces of which are oxidized by UV treatment, plasma treatment, heat treatment, acid treatment, and the like: and base materials having oxide thin films such as a silicon oxide film on the topmost surfaces thereof. In addition, in this embodiment, the first catalyst layer 5 and the laminate catalyst layer 9 are both formed using a tin chloride solution and a palladium chloride solution; however, the present invention is not limited thereto, and at least one of the first catalyst layer 5 and the laminate catalyst layer 9 may be formed using a tin-palladium colloidal solution. Furthermore, although the first catalyst layer 5 and the laminate catalyst layer 9 are both formed, the present invention is not limited thereto, and the first catalyst layer 5 may only be formed.

Next, the electroless plating method for forming the plating substrate, and the circuit forming method will be described with reference to FIGS. 2 to 5G.

Figure 2:
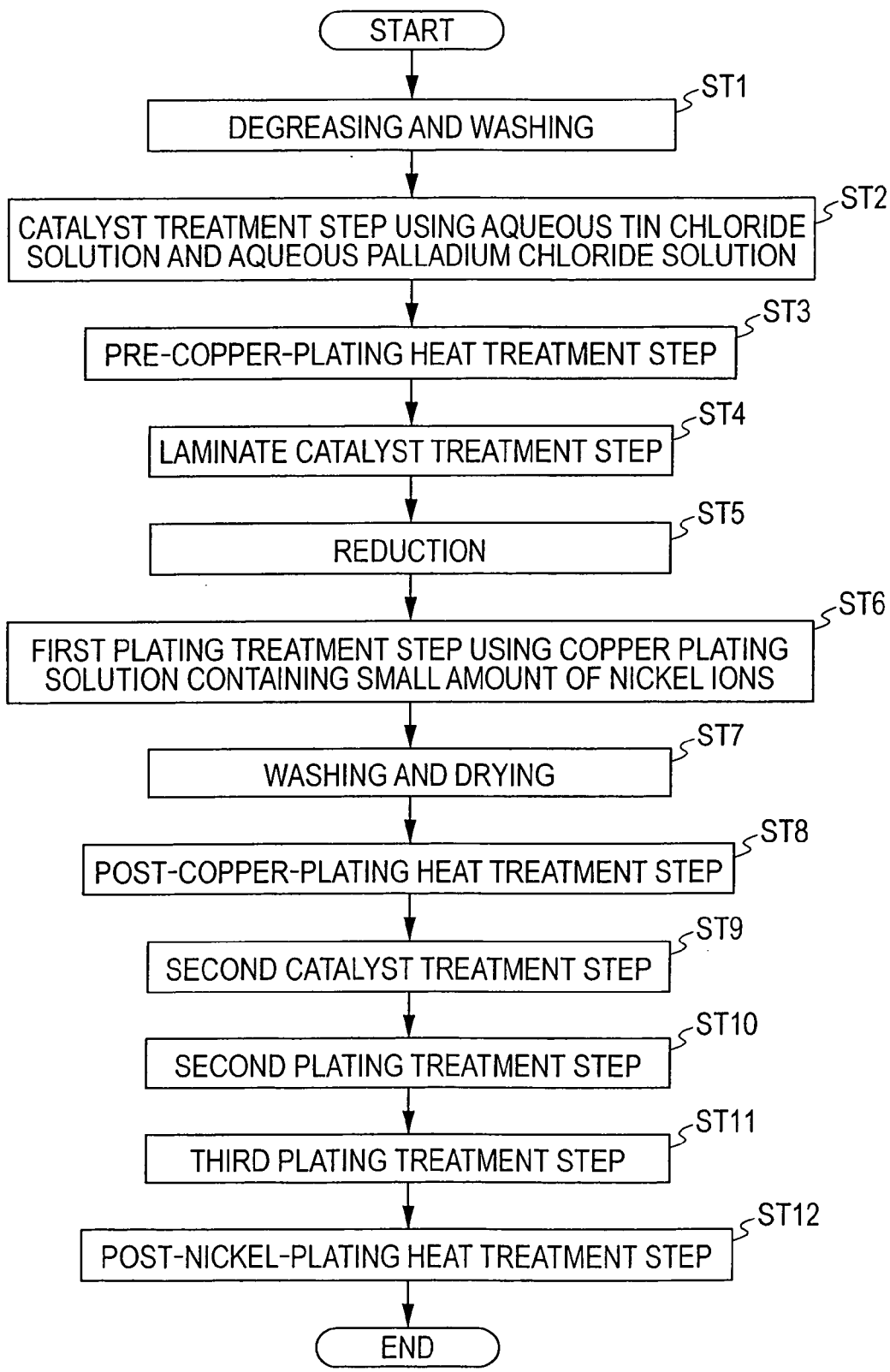
FIG. 2 is a flowchart showing steps of an electroless plating method according to an embodiment of the present invention.

FIG. 2 is a flowchart showing steps of an electroless plating method of a first embodiment for forming a plating film of the plating substrate described above, and FIGS. 3A to 3G are schematic views showing steps of a circuit forming method using the electroless plating method of this embodiment.

First, as the base material 1 used for the electroless plating method of this embodiment, the ceramic base material 1 having a glass component on a surface thereof is prepared by mixing approximately 50% of a borosilicate glass and approximately 50% of a fine alumina powder, followed by low-temperature firing. In this ceramic base material 1, due to the production process therefor, a first surface 1a is smoother than a second surface 2a, and in this embodiment, the copper plating films 6 are formed on both the first surface 1a and the second surface 2a. In this embodiment, the ceramic base material 1 is not limited to the above-described low-temperature co-fired ceramic base material 1 formed of 50% of a borosilicate glass and 50% of a fine alumina powder.

As shown in FIG. 2, in order to remove impurities, such as refuse and fats and oils, which adhere to this ceramic base material 1, the ceramic base material 1 is degreased and washed (ST1).

In addition, a hydrochloric aqueous tin chloride solution containing 1.33% of tin chloride and 0.54% of hydrochloric acid and an aqueous palladium chloride solution containing 0.015% of palladium chloride are prepared.

Next, the ceramic base material 1 thus degreased and washed is immersed in the aqueous tin chloride solution at 23° C. for 3 minutes, followed by sufficient washing with water.

Subsequently, the ceramic base material 1 is then immersed in the aqueous palladium chloride solution at 30° C. for 2 minutes, followed by sufficient washing with water.

Furthermore, the ceramic base material 1 is again immersed in the above aqueous tin chloride solution for 2 minutes and is then immersed in the above aqueous palladium chloride solution for 1 minute, so that a first catalyst treatment step is performed (ST2) which forms the first catalyst layers 5 on the first surface 2a and the second surface 2b of the ceramic base material 1.

In the first catalyst treatment step described above, instead of the aqueous tin chloride solution and the aqueous palladium chloride solution, a tin-palladium colloidal solution may be used.

As described above, after the first catalyst treatment step in which the ceramic base material 1 is alternately immersed in the aqueous tin chloride solution and the aqueous palladium chloride solution, this ceramic base material 1 is sufficiently washed with water and is then dried.

Subsequently, pre-copper-plating heat treatment is performed (ST3) for the ceramic base material 1 at a predetermined heat treatment temperature for a predetermined heat treatment time in an oxygen-containing atmosphere. In this step, the heat treatment is preferably performed at a heat treatment temperature of 250 to 450° C. for a heat treatment time of 10 minutes or more.

After this pre-copper-plating heat treatment step, the ceramic base material 1 is again immersed in an aqueous tin chloride solution and an aqueous palladium chloride solution, so that a laminate catalyst treatment step is performed (ST4) for forming the laminate catalyst layers 9 on the first surface 2a and the second surface 2b of the ceramic base material 1. In this laminate catalyst treatment step, instead of the aqueous tin chloride solution and the aqueous palladium chloride solution, a tin-palladium colloidal solution may be used.

Furthermore, after this laminate catalyst treatment step, the ceramic base material 1 is again degreased and washed and is then immersed in an aqueous formalin solution containing approximately 0.05% of sulfuric acid ($H_2SO_4$) and 4% of formalin for 1 minute, so that the first catalyst layers 5 and the laminate catalyst layers 9 are reduced (ST5).

Subsequently, without washing the ceramic base material 1, first plating treatment is performed for forming the copper plating films 6 on the first surface 2a and the second surface 2b. In this first plating treatment, a copper plating solution is used which contains copper (Cu) ions at a concentration of 2.5 g/L (0.039 mol/L), nickel (Ni) ions at a concentration of 0.138 g/L (0.0023 mol/L), potassium sodium tartrate tetrahydrate (Rochelle salt) ($KNaC_4H_4O_6 \cdot 4H_2O$) as a complexing agent, and approximately 0.2% of formaldehyde ($CH_2O$) as a reducing agent. That is, in the copper plating solution of this embodiment, 6 moles of nickel ions are contained relative to 100 moles of copper ions.

The amount of nickel ions contained in the copper plating solution is not limited to that of this embodiment and is preferably set in the range of 1 to 25 moles relative to 100 moles of copper ions contained in the copper plating solution. When the amount of nickel ions is less than 1 mole relative to 100 moles of copper ions contained in the copper plating solution, sufficient adhesion between the ceramic base material 1 and the copper plating film 6 may not be obtained. On the other hand, when the amount of nickel ions is more than 25 moles, the properties of copper are degraded. For example, the resistivity is considerably increased.

Furthermore, in this copper plating solution, approximately 1.5 g/L of sodium hydroxide (NaOH) is contained for pH adjustment so as to have a pH of approximately 12.6, and in addition, approximately 0.1% of a chelating agent is also contained.

Next, the ceramic base material 1 is immersed in the copper plating solution at 36° C. for a predetermined time, so that the first plating treatment is performed (ST6) in which the copper plating films 6 having a thickness of approximately 2 µm are formed on the first surface 2a and the second surface 2b.

Subsequently, after being sufficiently washed, the ceramic base material 1 provided with the copper plating films 6 is dried (ST7).

Furthermore, post-copper-plating heat treatment is performed (ST8) in which the dried ceramic base material 1 is processed at a heat treatment temperature not more than the glass transition temperature thereof in an inert gas atmosphere containing a nitrogen gas or the like or in an atmosphere such as a vacuum atmosphere substantially containing no oxygen and hydrogen. In this step, the heat treatment is preferably performed at a heat treatment temperature in the range of 250 to 450° C. for a heat treatment time of 10 minutes or more. As a result, the copper plating films 6 having superior adhesion are formed on the first surface 2a and the second surface 2b of the ceramic base material 1, thereby forming the plating substrate 20.

In the post-copper-plating heat treatment step, the heat treatment may be performed while a predetermined pressure is being applied to the ceramic base material 1. When the heat treatment is performed while a predetermined pressure is being applied, the heat treatment temperature is preferably set in the range of 150 to 400° C.

Next, second catalyst treatment is performed (ST9) in which second catalyst layers 10 are formed on the first surface 2a and the second surface 2b of the ceramic base material 1 provided with the copper plating films 6. In the second catalyst treatment step, for example, the ceramic base material 1 is immersed in a palladium solution at a predetermined temperature for a predetermined time. In this second catalyst treatment step, the condition of the catalyst is not limited to that in this embodiment.

Next, after being washed with purified water, the ceramic base material 1 provided with the second catalyst layers 10 is immersed in a nickel-phosphorus plating solution at a predetermined temperature for a predetermined time, so that second plating treatment is performed (ST10) in which nickel plating films 7 having a thickness of approximately 2 µm are formed on the first surface 2a and the second surface 2b. The second plating treatment step is preferably performed at approximately 80° C. for approximately 20 minutes.

Furthermore, the ceramic base material 1 is immersed in a gold plating solution at a predetermined temperature for a predetermined time, so that third plating treatment is performed (ST11) in which gold plating films 8 having a thickness of approximately 0.05 µm are formed on the first surface 2a and the second surface 2b. The third plating treatment step is preferably performed at approximately 60° C. for approximately 10 minutes.

The plating treatment conditions of the second and the third plating treatment steps are not limited to that described in this embodiment.

Subsequently, post-nickel-plating heat treatment is performed (ST12) in which the ceramic base material 1 provided with the nickel plating films 7 and the gold plating films 8 is processed at a predetermined heat treatment temperature for a predetermined heat treatment time in an inert gas atmosphere containing a nitrogen gas or the like or in an atmosphere such as a vacuum atmosphere substantially containing no oxygen and hydrogen. In this step, the heat treatment temperature is preferably set in the range of 150 to 350° C. The reasons for this are as follows. That is, when the temperature is less than 150° C., hydrogen incorporated during the plating may not be sufficiently removed, and on the other hand, when the temperature is more than 350° C., the nickel plating films 7 and the gold plating films 8 are liable to be peeled away. In addition, the heat treatment time is preferably set in the range of 10 minutes to 12 hours. The reasons for this are as follows. That is, when the time is less than 10 minutes, hydrogen incorporated during the plating may not be sufficiently removed, and on the other hand, when the time is more than 12 hours, the work efficiency is degraded. As a result, the nickel plating films 7 and the gold plating films 8, both having superior adhesion, are formed on the first surface 2a and the second surface 2b of the ceramic base material 1.

Next, the effect of the electroless plating method of this embodiment will be described.

According to this embodiment, since tin and palladium are present in the first catalyst layers 5 and the laminate catalyst layers 9 formed on the ceramic base material 1, and by the pre-copper-plating heat treatment and the post-copper-plating heat treatment, the tin is bonded to the oxygen of the glass component of the ceramic base material 1 at the interface between ceramic base material 1 and the catalyst layers, the first catalyst layers 5 and the laminate catalyst layers 9 can be favorably adhered to the ceramic base material 1.

In particular, in the pre-copper-plating heat treatment step, since the heat treatment is performed in an oxygen atmosphere, the tin can be more reliably bonded to the oxygen of the glass component. This is inferred since in the pre-copper-plating heat treatment step, when the heat treatment is performed in a nitrogen atmosphere, the adhesion of the ceramic base material 1 to the first catalyst layer 5 and the laminate catalyst layer 9 is decreased. That is, for example, when the pre-copper-plating heat treatment step is performed in a nitrogen atmosphere, oxygen in the glass component of the ceramic base material 1 is removed, and as a result, depletion of the oxygen occurs. Hence, the tin cannot be sufficiently bonded to the oxygen in the glass component, and as a result, the first catalyst layer 5 and the laminate catalyst layer 9 cannot be favorably adhered to the ceramic base material 1. Accordingly, when the pre-copper-plating heat treatment is performed in an oxygen atmosphere, the first catalyst layer 5 and the laminate catalyst layer 9 can be favorably adhered to the ceramic base material 1.

In addition, by the pre-copper-plating heat treatment and the post-copper-plating heat treatment, the tin and the palladium form metal bonds, and in addition, by the presence of the nickel ions in the copper plating solution, excellent adhesion of the copper plating film 6 to the first catalyst layer 5 and the laminate catalyst layer 9 can be ensured.

Furthermore, it has been understood that when the nickel plating film 7 and the gold plating film 8 are simply formed on the copper plating film 6, the copper plating film 6 provided therewith is easily peeled away from the base material 1. The reason for this is believed that hydrogen radicals penetrates the nickel plating film 7, the cold plating film 8, the copper plating film 6, and the interlayer during the second plating treatment and the third plating treatment and degrade the adhesion. In this case, when the post-nickel-plating heat treatment is performed after the second plating treatment and the third plating treatment are performed, the adhesion between the copper plating film 6 and the base material 1 can be improved. The reason for this is believed that hydrogen radicals in the nickel plating film 7, the gold plating film 8, the copper plating film 6, and the interlayer can be released therefrom by the post-nickel-plating heat treatment.

As a result, even when the first surface 2a and the second surface 2b of the ceramic base material 1 are mirror finished, the copper plating films 6 can be favorably adhered thereto, and hence, when electrodes are formed from the copper plating films 6, a fine pitch wiring pattern can be formed.

In addition, in the electroless plating method of this embodiment, it is not necessary to perform roughening treatment for forming irregularities on the first surface 2a and the second surface 2b of the ceramic base material 1, and hence various inconveniences caused by the roughening treatment can be avoided.

Furthermore, since the laminate catalyst treatment step is performed after the pre-copper-plating heat treatment step to form the laminate catalyst layer 9, the rate of formation of the copper plating film 6 in the first plating treatment step can be improved.

In addition, the adhesion of the copper plating film 6 to the nickel plating film 7 and the gold plating film 8 can be improved, and hence when an electrode is formed by plating the nickel plating film 7 and the gold plating film 8 on the copper plating film 6, a fine pitch wiring pattern can be formed.

In addition, since the plating film is conformably adhered to nanometer-order irregularities when the post-copper-plating heat treatment step is performed while a pressure is being applied, the adhesion of the copper plating film 6 can be improved by further decreasing the heat treatment temperature in the post-copper-plating heat treatment step.

Next, the circuit forming method using the above electroless plating method will be described with reference to FIGS. 3A to 3G.

Figure 3A:
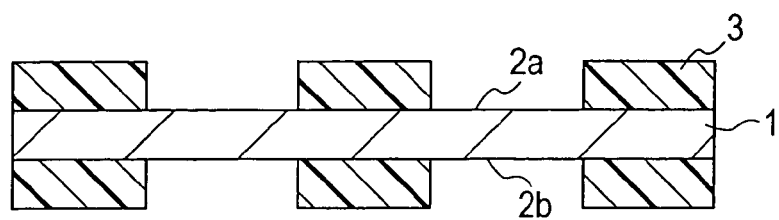
FIG. 3A is a schematic view showing a step of forming resists having a predetermined pattern, of a circuit forming method using the electroless plating method shown in FIG. 2.

First, after the ceramic base material 1 having a glass component on surfaces thereof is prepared, and as shown in FIG. 3A, a resist solution is applied to the first surface 2a and the second surface 2b of this ceramic base material 1, exposure and development are performed using a predetermined mask, so that resists 3 having a predetermined pattern is formed.

Figure 3B:
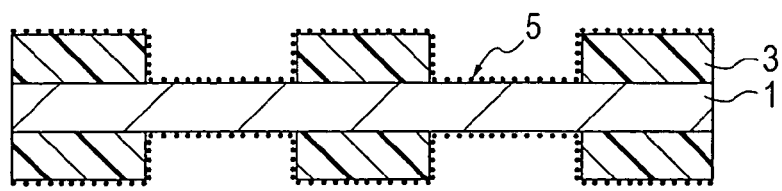
FIG. 3B is a schematic view showing a catalyst treatment step.
Figure 3C:
FIG. 3C is a schematic view showing a step of removing the resists to form first catalyst layers having a predetermined pattern.
Figure 3D:
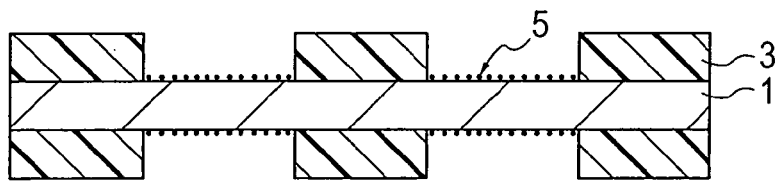
FIG. 3D is a schematic view showing a step of again forming resists.

Next, as shown in FIG. 3B, after the first catalyst layers 5 are formed on the first surface 2a and the second surface 2b of the ceramic base material 1 by the first catalyst treatment, the resists 3 are removed as shown in FIG. 3C, so that the first catalyst layers 5 are processed to have a predetermined pattern. Subsequently, after the pre-copper-plating heat treatment is performed by heating the ceramic base material 1 in an oxygen atmosphere, the resists 3 having a predetermined pattern are again formed as shown in FIG. 3D.

Figure 3E:
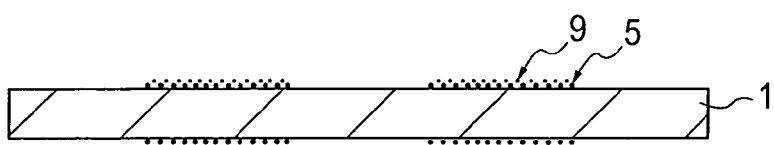
FIG. 3E is a schematic view showing a step of removing the resists to form laminate catalyst layers having a predetermined pattern.

Subsequently, after the laminate catalyst layers 9 are formed on the first surface 2a and the second surface 2b of the ceramic base material 1 by the laminate catalyst treatment, the resists 3 is removed, so that the first catalyst layers 5 and the laminate catalyst layers 9 form predetermined patterns as shown in FIG. 3E.

Figure 3F:
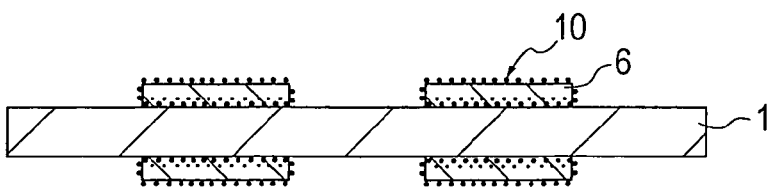
FIG. 3F is a schematic view showing a step of forming copper plating films.

Furthermore, after the ceramic base material 1 is immersed in an aqueous formalin solution for 1 minute which is equivalent to that in the first embodiment of the electroless plating method to reduce the catalyst layers 5 and the laminate catalyst layers 9, without performing washing, the ceramic base material 1 is immersed in a copper plating solution at 36° C. for a predetermined time, so that the copper plating films 6 are formed on the catalyst layers 5 as shown in FIG. 3F.

Next, after the ceramic base material 1 provided with the copper plating films 6 is sufficiently washed with water, drying is performed.

Figure 3G:
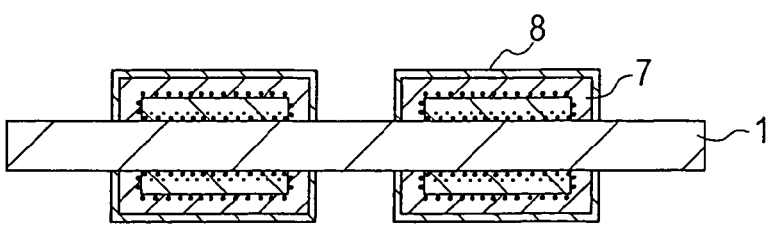
FIG. 3G is a schematic view showing a step of forming nickel plating films and gold plating films.

Furthermore, after the post-copper-plating heat treatment is performed for the ceramic base material 1 at a heat treatment temperature not more than the glass transition temperature thereof for a predetermined time, the second catalyst treatment is performed so that the second catalyst layers 10 are formed on the first surface 2a and the second surface 2b of the ceramic base material 1. Subsequently, as shown in FIG. 3G, on the copper plating films 6, the nickel plating films 7 and the gold plating films 8 are formed by steps equivalent to those in the electroless plating method described above.

Subsequently, the post-nickel-plating heat treatment is performed for the ceramic base material 1 for a predetermined heat treatment time at a temperature at which the hardness of the nickel compound is not changed, so that circuits having a predetermined wiring pattern are formed on the ceramic base material 1.

Next, the effect of the circuit forming method using the electroless plating method of this embodiment will be described.

According to this embodiment, by forming the circuits using the electroless plating method described above, the first catalyst layers 5 and the laminate catalyst layers 9 can be favorably adhered to the ceramic base material 1, and in addition to that, the first catalyst layers 5 and the laminate catalyst layers 9 can be favorably adhered to the copper plating films 6. Furthermore, the copper plating films 6 can be favorably adhered to the nickel plating films 7 and the gold plating films 8 with the second catalyst layers 10 provided therebetween.

Accordingly, since the circuits can be formed on the mirror-finished first surface 2a and second surface 2b of the ceramic base material 1, fine pitch wiring patterns can be formed on the ceramic base material 1.

In addition, since the circuits can be formed from the plating films provided on the first surface 2a and the second surface 2b which are not processed by roughening treatment, the high frequency properties of the circuits can be improved.

Next, an electroless plating method of a second embodiment according to the present invention will be described with reference to FIGS. 4 to 5G.

First, as the ceramic base material 1 used for the electroless plating method of this embodiment, the ceramic base material 1 is prepared by mixing approximately 50% of a borosilicate glass and approximately 50% of a fine alumina powder, followed by low-temperature firing. This ceramic base material 1 has via holes 11 formed therein, and Ag layers 12 are formed inside the via holes 11 using a Ag-based conductive material, so that vias 13 are formed to connect circuits to each other which are formed on the first surface 2a and the second surface 2b of the ceramic base material 1. Also in the second embodiment, the ceramic base material 1 is not limited to the above-described low-temperature co-fired ceramic base material 1 which is formed of 50% of a borosilicate glass and 50% of a fine alumina powder.

Figure 4:
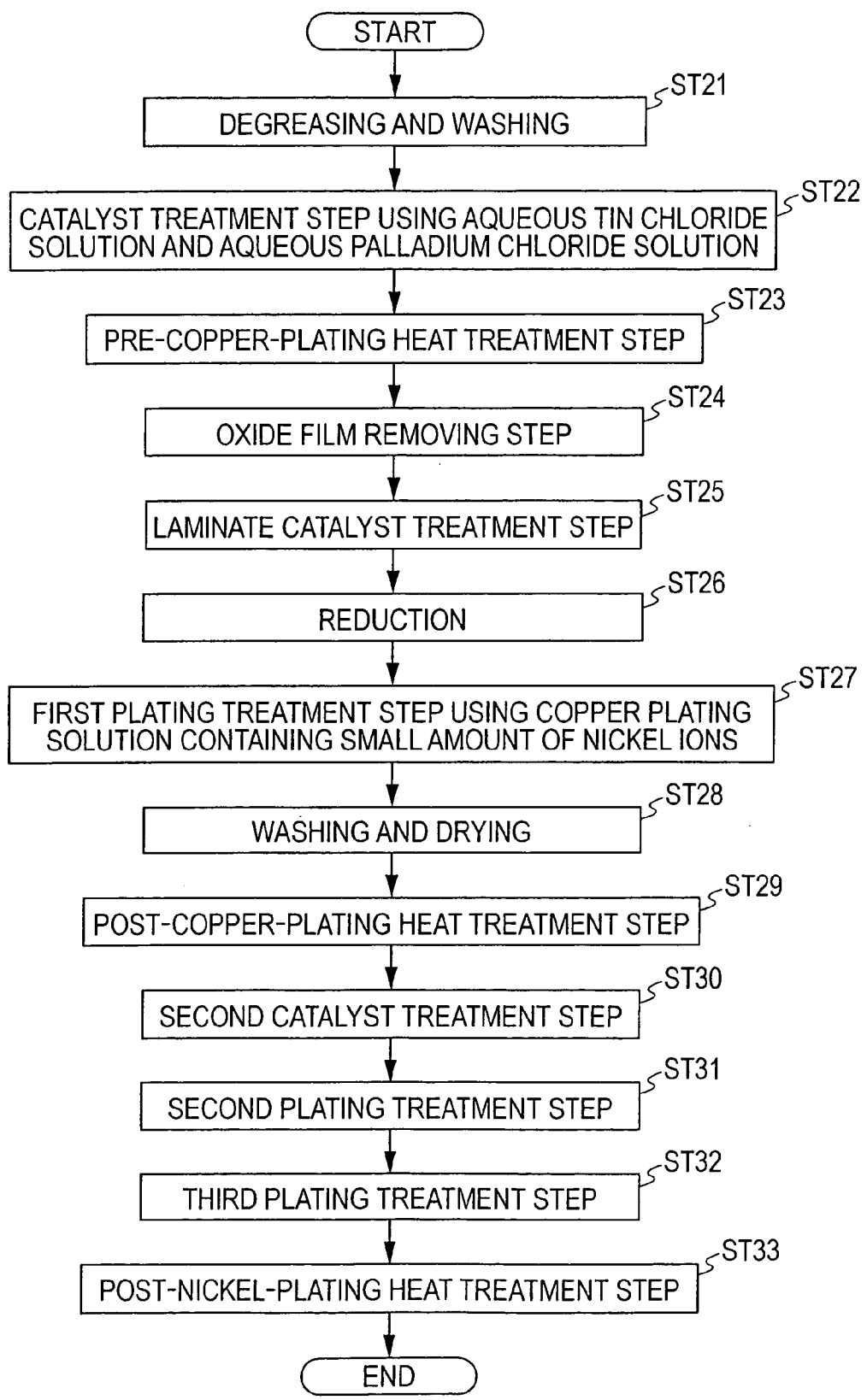
FIG. 4 is a flowchart showing steps of an electroless plating method according to another embodiment of the present invention.

As shown in FIG. 4, the ceramic base material 1 is degreased and washed (ST21).

Subsequently, as is the case of the first embodiment, after the first catalyst treatment is performed (ST22), the ceramic base material 1 is sufficiently washed with water and is then dried.

Next, after the pre-copper-plating heat treatment is performed (ST23) for the ceramic base material 1 at a temperature not less than the decomposition temperature (150 to 180° C.) of a silver oxide in an oxygen-containing atmosphere in a manner equivalent to that in the first embodiment, by using an aqueous $H_2O_2$ solution at room temperature, treatment for removing oxide films formed on the surfaces of the vias 13 is performed (ST24). In this oxide film removing step, besides an aqueous $H_2O_2$ solution, for example, purified water, hot purified water, ammonia water, or diluted nitric acid may also be used.

Subsequently, after this oxide film removing step, the laminate catalyst treatment is performed (ST25) in a manner equivalent to that in the first embodiment.

Furthermore, after being sufficiently washed with water, the ceramic base material 1 is immersed in an aqueous formalin solution containing approximately 0.05% of sulfuric acid ($H_2SO_4$) and approximately 4% of formalin for 1 minute, so that the first catalyst layers 5 and the laminate catalyst layers 9 are reduced (ST26).

Subsequently, as is the case of the first embodiment, the first plating treatment is performed (ST27) for forming the copper plating films 6 on the first surface 2a and the second surface 2b of the ceramic base material 1.

Next, after being sufficiently washed with water, the ceramic base material 1 provided with the copper plating films 6 are dried (ST28).

Furthermore, the post-copper-plating heat treatment is performed (ST29) in which the dried ceramic base material 1 is processed by heating at a heat treatment temperature not more than the glass transition temperature thereof for a predetermined heat treatment time in an inert gas atmosphere containing a nitrogen gas or the like or in an atmosphere such as a vacuum atmosphere substantially containing no oxygen and hydrogen. In this step, the heat treatment is preferably performed at a heat treatment temperature of 250 to 450° C. for a heat treatment time of 10 minutes or more. As a result, the copper plating films 6 are formed on the first surface 2a and the second surface 2b of the ceramic base material 1.

In the post-copper-plating heat treatment step, the heat treatment may be performed while a predetermined pressure is being applied to the ceramic base material 1. When the heat treatment is performed while a predetermined pressure is being applied, the heat treatment temperature is preferably set in the range of 150 to 400° C.

Next, the second catalyst treatment is performed (ST30) in which the second catalyst layers 10 are formed on the first surface 2a and the second surface 2b of the ceramic base material 1 processed by the plating treatment. In the second catalyst treatment step, for example, the ceramic base material 1 is immersed in a palladium solution at a predetermined temperature for a predetermined time. In this second catalyst treatment step, the condition of the catalyst is not limited to that in this embodiment.

Next, after the ceramic base material 1 provided with the second catalyst layers 10 is washed with purified water, in a manner equivalent to that in the first embodiment, the second plating treatment is performed (ST31) for forming the nickel plating films 7 on the first surface 2a and the second surface 2b of the ceramic base material 1. Subsequently, the third plating treatment is performed (ST32) for forming the gold plating films 8.

Subsequently, the post-nickel-plating heat treatment is performed (ST33) for the ceramic base material 1 in a manner equivalent to that in the first embodiment.

Next, the effect of the electroless plating method of the second embodiment will be described.

According to the second embodiment, as is the case of the first embodiment, the first catalyst layers 5 and the laminate catalyst layers 9 can be favorably adhered to the ceramic base material 1, and in addition to that, the first catalyst layers 5 and the laminate catalyst layers 9 can be favorably adhered to the copper plating films 6. In addition, since the post-nickel-plating heat treatment is performed after the second plating treatment step and the third plating treatment step are performed, the adhesion between the copper plating films 6 and the base material 1 can be improved. Furthermore, since tin and palladium are present on the vias 13, and palladium and silver are tightly bonded to each other by the pre-copper-plating heat treatment and the post-copper-plating heat treatment, the Ag layers 12 of the vias 13 can be favorably adhered to the first catalyst layers 5 and the laminate catalyst layers 9.

In this embodiment, when the heat treatment temperature in the pre-copper-plating heat treatment step is set to not less than the decomposition temperature of a silver oxide, the formation of a silver oxide on the Ag layer 12 of the via 13 during the heat treatment can be prevented.

In addition, as for the Ag layer of the via 13, after the pre-copper-plating heat treatment, although oxide films are formed in a step in which the temperature is decreased, the oxide films formed on the Ag layer 12 can be removed in the oxide film removing step.

Hence, in the ceramic base material 1 having a glass component on surfaces thereof and provided with the Ag-based vias 13, even when the first surface 2a and the second surface 2b of the ceramic base material 1 are mirror finished, the copper plating films 6 can be favorably adhered to the first surface 2a and the second surface 2b, and as a result, when an electrode is formed from the copper plating film 6, a fine pitch wiring pattern can be formed. In addition, in a finished product in which the copper plating films 6 are formed on the ceramic base material 1, the formation of oxide films on the Ag layer 12 of the via 13 can be prevented.

Furthermore, also in the electroless plating method according to the second embodiment, roughening treatment for forming irregularities on the first surface 2a and the second surface 2b of the ceramic base material 1 is not required, and hence various inconveniences caused by the roughening treatment can be avoided.

Furthermore, since the laminate catalyst treatment step is performed after the pre-copper-plating heat treatment step to form the laminate catalyst layers 9, the rate of formation of the copper plating film 6 in the plating treatment step can be improved.

In addition, the adhesion of the copper plating film 6 to the nickel plating film 7 and the gold plating film 8 can be improved, and when an electrode is obtained by forming the nickel plating film 7 and the gold plating film 8 on the copper plating film 6, a fine pitch wiring pattern can be formed.

Next, the circuit forming method using the electroless plating method of the second embodiment will be described with reference to FIGS. 5A to 5G.

FIGS. 5A to 5G are schematic views for illustrating steps of the circuit forming method of this embodiment.

First, the ceramic base material 1 having a glass component on surfaces thereof is prepared. In this ceramic base material 1, the via holes 11 are formed, the Ag layers 12 are provided therein, and hence the Ag-based vias 13 are formed. This ceramic base material 1 is degreased and washed.

Figure 5A:
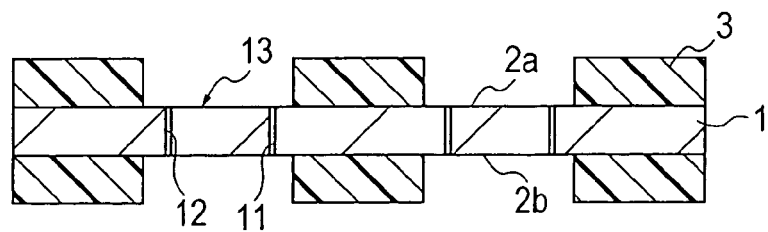
FIG. 5A is a schematic view showing a step of forming resists having a predetermined pattern, of a circuit forming method using the electroless plating method shown in FIG. 4.

Next, as shown in FIG. 5A, a resist solution is applied to the first surface 2a and the second surface 2b of this ceramic base material 1, and exposure and development are performed using a predetermined mask, so that the resists 3 having a predetermined pattern are formed. Subsequently, washing is sufficiently performed with water.

Figure 5B:
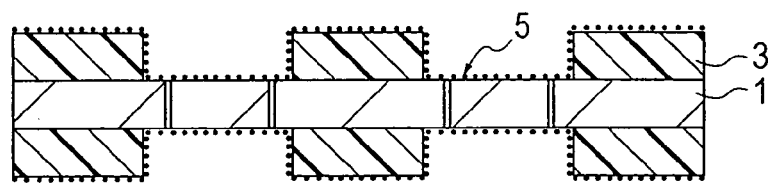
FIG. 5B is a schematic view showing a catalyst treatment step.
Figure 5C:
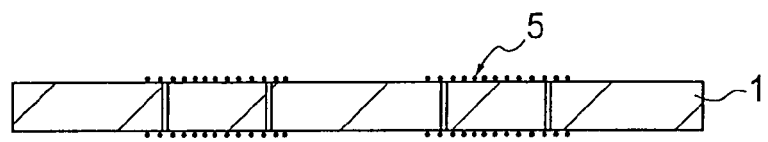
FIG. 5C is a schematic view showing a step of removing the resists to form first catalyst layers having a predetermined pattern.

Next, as shown in FIG. 5B, after the first catalyst layers 5 are formed on the first surface 2a and the second surface 2b of the ceramic base material 1 by the first catalyst treatment, the resists 3 are removed as shown in FIG. 5C, so that the first catalyst layers 5 are processed to have a predetermined pattern. Subsequently, the pre-copper-plating heat treatment is performed by heating the ceramic base material 1 in an oxygen atmosphere, and during a cooling step for cooling the ceramic base material 1, treatment is performed for removing the oxide films formed on the surfaces of the vias 13.

Figure 5D:
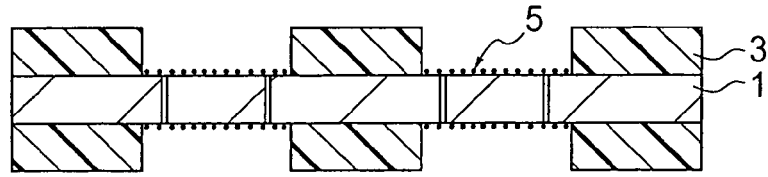
FIG. 5D is a schematic view showing a step of again forming resists.
Figure 5E:
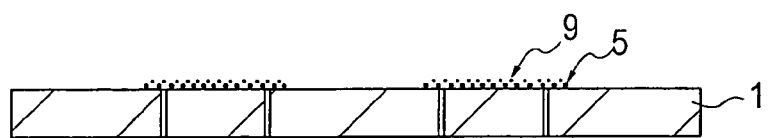
FIG. 5E is a schematic view showing a step of removing the resists to form laminate catalyst layers having a predetermined pattern.

Subsequently, after the resists 3 having a predetermined pattern are formed again as shown in FIG. 5D, the laminate catalyst treatment is performed so that the laminate catalyst layers 9 are formed on the first surface 2a and the second surface 2b of the ceramic base material 1. Next, the resists 3 are removed so that predetermined patterns are formed by the first catalyst layers 5 and the laminate catalyst layers 9 as shown in FIG. 5E, followed by sufficient washing of the ceramic base material 1 with water.

Figure 5F:
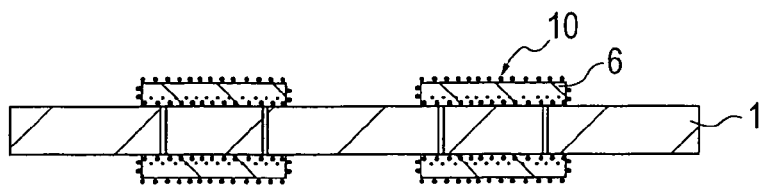
FIG. 5F is a schematic view showing a step of forming copper plating films.
Figure 5G:
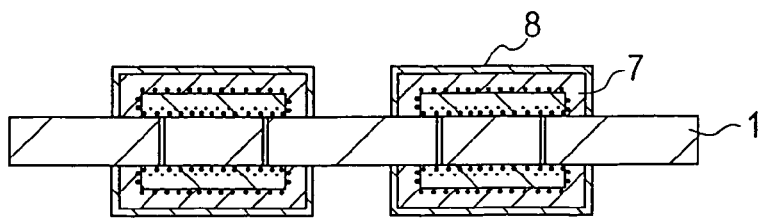
FIG. 5G is a schematic view showing a step of forming nickel plating films and gold plating films.

Furthermore, after the ceramic base material 1 is immersed in an aqueous formalin solution to reduce the first catalyst layers 5 and the laminate catalyst layers 9, without performing washing, the ceramic base material 1 is immersed in a copper plating solution for a predetermined time, so that the copper plating films 6 are formed on the catalyst layers 5 and the laminate catalyst layers 9 as shown in FIG. 5F.

Next, after the ceramic base material 1 provided with the copper plating films 6 is sufficiently washed with water, drying is performed.

Furthermore, after the post-copper-plating heat treatment is performed for the ceramic base material 1 at a heat treatment temperature not more than the glass transition temperature thereof for a predetermined time, the second catalyst treatment is performed so that the second catalyst layers 10 are formed on the first surface 2a and the second surface 2b of the ceramic base material 1. Subsequently, as shown in FIG. 5G, on the copper plating films 6, the nickel plating films 7 and the gold plating films 8 are formed by the second plating treatment step and the third plating treatment step, respectively.

Subsequently, the post-nickel-plating heat treatment is performed for the ceramic base material 1 for a predetermined heat treatment time at a temperature at which the hardness of the nickel compound is not changed, so that circuits having a predetermined wiring pattern are formed on the ceramic base material 1.

According to the second embodiment, by forming the circuits using the electroless plating method described above, the first catalyst layers 5 and the laminate catalyst layers 9 can be favorably adhered to the ceramic base material 1, and in addition to that, the first catalyst layers 5 and the laminate catalyst layers 9 can be favorably adhered to the copper plating films 6. Furthermore, the copper plating films 6 can be favorably adhered to the nickel plating films 7 and the gold plating films 8.

Accordingly, since the circuits can be formed on the mirror-finished first surface 2a and second surface 2b of the ceramic base material 1 having the Ag-based vias 13 therein, fine pitch wiring patterns can be formed on the ceramic base material 1, and the high frequency properties of the circuit can be improved.

In addition, since the heat treatment temperature in the pre-copper-plating heat treatment is set to not less than the decomposition temperature of a silver oxide, the formation of a silver oxide during the pre-copper-plating heat treatment step can be prevented, and in addition, in the oxide film removing step, the oxide films formed on the Ag layers 12 of the vias 13 can be removed.

In the embodiments of the circuit forming methods using the first and the second electroless plating methods described above, the plating treatment is performed after the first catalyst layers 5 and the laminate catalyst layers 9 are processed to have a predetermined pattern; however, the present invention is not limited thereto. For example, the following embodiment of the circuit forming method using the electroless plating method of the present invention may also be used. That is, after the first plating treatment is performed, a resist solution is applied onto the copper plating films 6 and is then formed into the resists 3 having a predetermined pattern by exposure and development. Subsequently, after the copper plating films 6 are processed by etching to have a predetermined pattern, the resists 3 remaining on the copper plating films 6 are removed, so that the circuits are formed.

Next, another electroless plating method for forming the plating substrate 20 and another circuit forming method will be described with reference to FIGS. 6 to 7E.

Figure 6:
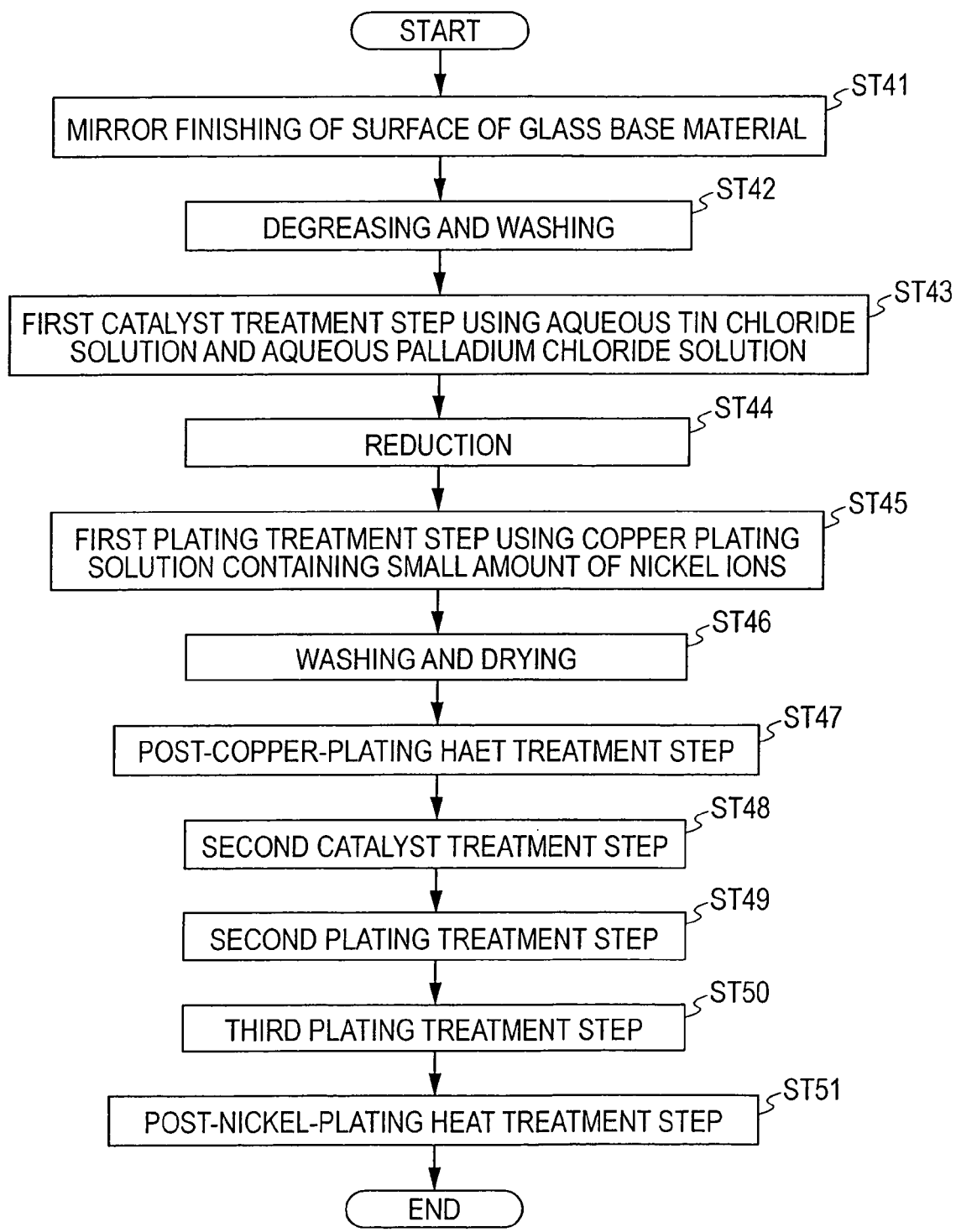
FIG. 6 is a flowchart showing steps of an electroless plating method according to another embodiment of the present invention.

FIG. 6 is a flowchart showing steps of an electroless plating method according to a third embodiment.

First, as the base material 1 used for the electroless plating method of this embodiment, a glass base material 1 composed of a borosilicate glass is prepared. However, as the glass base material 1, besides a borosilicate glass, various glass materials, such as a soda lime glass, may also be used.

Next, as shown in FIG. 6, after one surface of the glass base material 1 on which the copper plating film 6 is formed is polished to have a mirror-finished surface (ST41), in order to remove impurities, such as refuse and fats and oils, which adhere to this glass base material 1, the glass base material 1 is degreased and washed (ST42). When the glass base material 1 is used having a superior mirror surface without polishing, the step (ST41) of polishing the surface of the glass base material 1 may be omitted in some cases.

In addition, a hydrochloric aqueous tin chloride solution containing 1.33% of tin chloride and 0.54% of hydrochloric acid and an aqueous palladium chloride solution containing 0.015% of palladium chloride are prepared.

Next, the glass base material 1 thus degreased and washed is immersed in the aqueous tin chloride solution at 23° C. for 3 minutes, followed by sufficient washing with water.

Subsequently, the glass base material 1 is then immersed in the aqueous palladium chloride solution at 30° C. for 2 minutes, followed by sufficient washing with water.

Furthermore, the glass base material 1 is again immersed in the aqueous tin chloride solution for 2 minutes and was then immersed in the aqueous palladium chloride solution for 1 minute, so that the first catalyst treatment is performed which forms the first catalyst layer 5 (ST43).

In the first catalyst treatment step described above, instead of the aqueous tin chloride solution and the aqueous palladium chloride solution, a tin-palladium colloidal solution may be used.

As described above, after the first catalyst treatment step is performed in which the glass base material 1 is alternately immersed in the aqueous tin chloride solution and the aqueous palladium chloride solution, this glass base material 1 is sufficiently washed with water and is then immersed in an aqueous formalin solution containing approximately 0.05% of sulfuric acid ($H_2SO_4$) and approximately 4% of formalin, so that the first catalyst layer 5 is reduced (ST44).

Subsequently, the first plating treatment is performed for forming the copper plating film 6 on the surface of the glass base material 1. In this first plating treatment, a copper plating solution is used which contains copper (Cu) ions at a concentration of 2.5 g/L (0.039 mol/L), nickel (Ni) ions at a concentration of 0.23 g/L (0.0039 mol/L), potassium sodium tartrate tetrahydrate (Rochelle salt) ($KNaC_4H_4O_6 \cdot 4H_2O$) as a complexing agent, and approximately 0.2% of formaldehyde ($CH_2O$) as a reducing agent. That is, 10 moles of nickel ions are contained in the copper plating solution of this embodiment relative to 100 moles of copper ions contained therein.

The amount of nickel ions in the copper plating solution is not limited to that of this embodiment and is preferably in the range of 1 to 25 moles relative to 100 moles of copper ions contained in the copper plating solution.

Furthermore, in this copper plating solution, approximately 1.5 g/L of sodium hydroxide is contained for pH adjustment so as to have a pH of approximately 12.6, and in addition, approximately 0.1% of chelating agent is also contained.

Next, the glass base material 1 is immersed in the copper plating solution at 36° C. for a predetermined time so as to perform the first plating treatment (ST45) in which the copper plating film 6 having a thickness of approximately 2 µm is formed on the surface of the glass base material 1.

Subsequently, after being sufficiently washed, the glass base material 1 provided with the copper plating film 6 is dried (ST46).

Furthermore, the post-copper-plating heat treatment is performed (ST47) in which the dried glass base material 1 is processed by heating at a heat treatment temperature not more than the glass transition temperature thereof in an inert gas atmosphere containing a nitrogen gas or the like or in an atmosphere such as a vacuum atmosphere substantially containing no oxygen and hydrogen. In this post-copper-plating heat treatment step, the heat treatment is preferably performed at a heat treatment temperature in the range of 250 to 450° C. for a heat treatment time of 10 minutes or more. As a result, the copper plating film is formed on the surface of the glass base material 1, thereby forming the plating substrate 20.

In the post-copper-plating heat treatment, the heat treatment may be performed while a predetermined pressure is being applied to the glass base material 1. When the heat treatment is performed while a predetermined pressure is being applied, the heat treatment temperature is preferably set in the range of 150 to 400° C.

Next, the second catalyst treatment is performed (ST48) in which the second catalyst layer 10 is formed on the glass base material 1 provided with the copper plating film. In the second catalyst treatment step, for example, the glass base material 1 is immersed in a palladium solution at a predetermined temperature for a predetermined time. In this second catalyst treatment step, the condition of the catalyst is not limited to that in this embodiment.

Next, after being washed with purified water, the glass base material 1 provided with the second catalyst layer 10 is immersed in a nickel-phosphorus plating solution at a predetermined temperature for a predetermined time, so that the second plating treatment is performed (ST49) in which the nickel plating film 7 having a thickness of approximately 2 µm is formed. The second plating treatment step is preferably performed at approximately 80° C. for approximately 20 minutes.

Furthermore, the glass base material 1 is immersed in a gold plating solution at a predetermined temperature for a predetermined time so that the third plating treatment is performed (ST50) in which the gold plating film 8 having a thickness of approximately 0.05 µm is formed. The third plating treatment step is preferably performed at a plating temperature of approximately 60° C. for a plating time of approximately 10 minutes.

The plating treatment conditions of the second and the plating treatment steps are not limited to that in this embodiment.

Subsequently, the post-nickel-plating heat treatment is performed (ST51) in which the glass base material 1 provided with the nickel plating film 7 and the gold plating film 8 is processed by heating at a predetermined heat treatment temperature for a predetermined heat treatment time in an inert gas atmosphere containing a nitrogen gas or the like or in an atmosphere such as a vacuum atmosphere substantially containing no oxygen and hydrogen. In this post-nickel-plating heat treatment, the heat treatment temperature is preferably set in the range of 150 to 350° C., and the heat treatment time is preferably set in the range of 10 minutes to 12 hours. As a result, the nickel plating film 7 and the gold plating film 8, both having superior adhesion, are formed on the glass base material 1.

Next, the effect of the electroless plating method of the third embodiment will be described.

According to this embodiment, it is believed that since tin and palladium are present in the first catalyst layer 5 formed on the glass base material 1, and the heat treatment is performed after the plating treatment, the tin is bonded to the oxygen of the glass at the interface between the glass base material 1 and the first catalyst layer 5, and hence the first catalyst layer 5 can be tightly adhered to the glass base material 1. In addition, it is believed that since the tin and the palladium form metal bonds in the post-copper-plating heat treatment, and the nickel ions are present in the copper plating solution, excellent adhesion between the first catalyst layer 5 and the copper plating film 6 can be ensured. This effect of improving the adhesion can be more significantly enhanced when the impurities on the surface of the base material are removed by the above degreasing step.

Furthermore, it has been understood that when the nickel plating film 7 and the cold plating film 8 are simply formed on the copper plating film 6, the copper plating film 6 provided therewith is easily peeled away from the base material 1. Hence, when the post-nickel-plating heat treatment is performed after the second plating treatment and the third plating treatment are performed, the adhesion between the copper plating film 6 and the base material 1 can be improved.

Hence, even when the surface of the glass base material 1 is mirror finished, the copper plating film 6 can be tightly adhered thereto, and hence, when an electrode is formed from the copper plating film 6, a fine pitch wiring pattern can be formed. In addition, in the electroless plating method of this embodiment, it is not necessary to perform roughening treatment for forming irregularities on the surface of the glass base material 1, and hence various inconveniences caused by the roughening treatment can be avoided.

Furthermore, the adhesion of the copper plating film 6 to the nickel plating film 7 and the gold plating film 8 can be improved, and hence when an electrode is formed by plating the nickel plating film 7 and the gold plating film 8 on the copper plating film 6, a fine pitch wiring patterns can be formed.

In addition, since the plating film is conformably adhered to nanometer-order irregularities when the post-copper-plating heat treatment is performed while a pressure is being applied, the adhesion of the copper plating film 6 can be improved by further decreasing the heat treatment temperature of the post-copper-plating heat treatment.

Next, a circuit forming method using the above electroless plating method of the third embodiment will be described with reference to FIGS. 7A to 7E.

FIGS. 7A to 7E are schematic views showing steps of the circuit forming method of this embodiment.

First, after a glass base material composed of a borosilicate glass or the like is prepared as the glass base material 1 for forming the circuit substrate in this embodiment, a surface of this glass base material 1 to be processed is mirror finished by polishing, followed by-degreasing and washing.

Figure 7A:
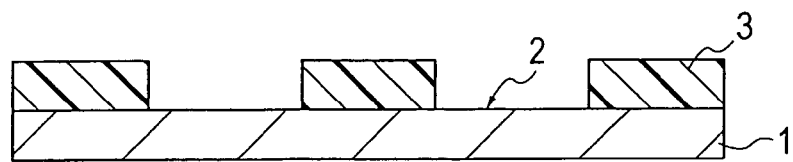
FIG. 7A is a schematic view showing a step of forming a resist having a predetermined pattern, of a circuit forming method using the electroless plating method shown in FIG. 6.

Next, as shown in FIG. 7A, a photoresist solution is applied onto a surface 2 of the glass base material 1 and is then processed by exposure and development using a predetermined mask, so that the resist 3 having a predetermined pattern is formed.

Figure 7B:
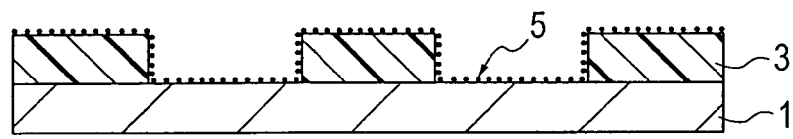
FIG. 7B is a schematic view showing a catalyst treatment step.

Next, as shown in FIG. 7B, after the first catalyst layer 5 is formed by the catalyst treatment, the resist 3 is removed, so that the first catalyst layer 5 is processed to have a predetermined pattern.

Figure 7C:
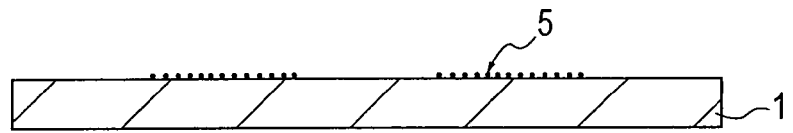
FIG. 7C is a schematic view showing a step of removing the resist.

Furthermore, after the glass base material 1 is immersed in an aqueous formalin solution for 1 minute to reduce the catalyst layer 5, without performing washing, as shown in FIG. 7C, plating treatment is performed for the glass base material 1 by a step equivalent to that in the first embodiment.

Figure 7D:
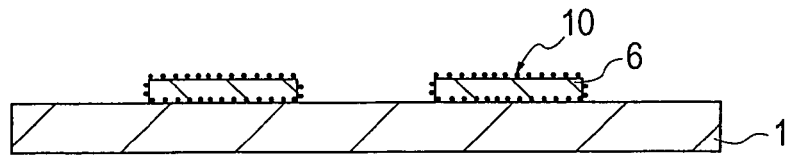
FIG. 7D is a schematic view showing a step of forming a copper plating film.
Figure 7E:
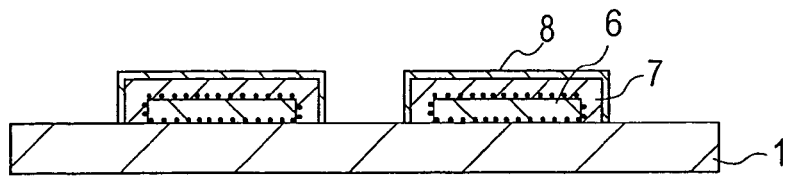
FIG. 7E is a schematic view showing a step of forming a nickel plating film and a gold plating film.

Next, as shown in FIG. 7D, the glass base material 1 is immersed in a copper plating solution at 36° C. for a predetermined time, so that the copper plating film 6 having a thickness of approximately 2 μm is formed on the first catalyst layer 5.

Subsequently, after the glass base material 1 provided with the copper plating film 6 is sufficiently washed with water, drying is performed.

Furthermore, after the post-copper-plating heat treatment is performed for the glass base material 1 at a heat treatment temperature not more than the glass transition temperature thereof for a predetermined time, the second catalyst treatment is performed so that the second catalyst layer 10 is formed on the glass base material 1. Subsequently, as shown in FIG. 7E, on the copper plating film 6, the nickel plating film 7 and the gold plating film 8 are formed by steps equivalent to those in the electroless plating method described above.

Next, the post-nickel-plating heat treatment is performed for the glass base material 1 for a predetermined heat treatment time at a temperature at which the hardness of the nickel compound is not changed, so that a circuit having a predetermined wiring pattern is formed on the glass base material 1.

Next, the effect of the circuit forming method using the electroless plating method of the third embodiment will be described.

According to this embodiment, the first catalyst layer 5 can be favorably adhered to the glass base material 1, and in addition to that, the first catalyst layer 5 can be favorably adhered to the copper plating film 6. Furthermore, the copper plating film 6 can be favorably adhered to the nickel plating film 7 and the gold plating film 8 with the second catalyst layer 10 provided therebetween.

Accordingly, since a circuit can be formed on the mirror-finished surface 2 of the glass base material 1, a fine pitch wiring pattern can be formed on the glass base material 1.

In addition, since the circuit can be formed from the plating film provided on the mirror-finished surface 2, the high frequency properties of the circuit can be improved.

It is to be naturally understood that the present invention is not limited to the above embodiments, and whenever necessary, various modifications may be made without departing from the scope of the present invention.

For example, in the above embodiments, after the second and the third plating treatment are performed, by the post-nickel-plating heat treatment, the adhesion between the copper plating film 6 and the base material 1 is improved; however, the present invention is not limited thereto. For example, by performing heat treatment at a predetermined temperature for a predetermined time after the second plating treatment, the adhesion between the copper plating film 6 and the base material 1 can be improved.

EXAMPLES

Example 1

Approximately 50% of a borosilicate glass and approximately 50% of a fine alumina powder were mixed to form ceramic base materials each containing a glass component, and the ceramic base materials thus formed were degreased and washed.

Next, the ceramic base materials thus degreased and washed were immersed in the aqueous tin chloride solution of the first embodiment at 23° C. for 3 minutes, followed by sufficient washing with water. In addition, the ceramic base materials thus washed were then immersed in the aqueous palladium chloride solution described in the first embodiment at 30° C. for 2 minutes.

Furthermore, the ceramic base materials were again immersed in the above aqueous tin chloride solution for 2 minutes and then immersed in the above aqueous palladium chloride solution for 1 minute to form catalyst layers and were sufficiently washed with water, followed by drying.

Subsequently, as shown in Table 1, pre-copper-plating heat treatment was performed for the ceramic base materials at various heat treatment temperature in the range of 250 to 450° C. for a heat treatment time in the range of 10 minutes to 2 hours in the air.

After this pre-copper-plating heat treatment, the ceramic base materials were immersed in the aqueous formalin solution of the first embodiment for 1 minute, so that the catalyst layers were reduced.

In addition, in this example, a copper plating solution was prepared which contained copper ions at a concentration of 2.5 g/L (0.039 mol/L), potassium sodium tartrate tetrahydrate, approximately 0.2% of formaldehyde ($CH_2O$), approximately 1.5 g/L of sodium hydroxide (NaOH), and approximately 0.1% of a chelating agent. By using the copper plating solution described above as a fundamental composition, as shown in Table 1, five types of copper plating solutions were prepared, that is, solutions further containing nickel ions at a concentration of 0.00039, 0.0023, 0.0039, 0.01, and 0 moles/L were prepared.

Next, the ceramic base materials prepared as described above in this example were immersed in the respective copper plating solutions at 36° C. to plate copper films having a thickness of 2 μm and were then sufficiently washed, followed by drying.

Furthermore, as shown in Table 1, post-copper-plating heat treatment was performed at various heat treatment temperatures in the range of 250 to 450° C. for a heat treatment time in the range of 10 minutes to 2 hours in a nitrogen atmosphere, so that copper plating films were formed on the ceramic base materials.

The adhesion of the copper plating films to the ceramic base materials was measured, the copper plating films being formed as described above by changing the amount of nickel ions in the copper plating solution of the plating treatment, and by changing the heat treatment temperatures and times in the pre-copper-plating heat treatment and in the post-copper-plating heat treatment.

For the adhesion evaluation, by using an aluminum-made evaluation pin having a diameter of 2 mm, the bottom of which is flat and is coated with an epoxy resin, the bottom of the pin was brought into contact with the copper plating film and was then heated to 150° C., so that the evaluation pin was bonded to the copper plating film with the epoxy resin provided therebetween. Subsequently, a tensile test was performed using the evaluation pin, and the tensile strengths (MPa) at which the copper plating films were separated from the ceramic base materials were measured for the first and the second surfaces of the ceramic base materials, the second surface having a rough surface as compared to that of the first surface (Sebastian method).

As shown in Table 1, when the copper plating solutions having a nickel ion concentration of 0.00039 to 0.01 mole/L were used, at both first and second surface sides of the ceramic base material, the tensile strength was approximately 30 MPa or more; hence, the adhesion of the copper plating film could be improved so that the ceramic base material was broken or so that the bonding portion between the evaluation pin and the copper plating film was broken. In this evaluation, separation was not observed at the interface between the copper plating film and the catalyst layer and the interface between the catalyst layer and the ceramic base material. On the other hand, when the copper plating solution containing no nickel ions was used, the adhesion between the copper plating film and the ceramic base material could hardly be ensured.

In addition, when an electroless plating method was performed for a silicon oxide film base material, alumina sintered base material, sapphire base material, quartz base material, and single crystal quartz base material under the same conditions as those of Example 1 using the copper plating solutions having a concentration of 0.00039 to 0.01 mol/L, the tensile strength of the copper plating film of each base material was approximately 50 MPa or more, and hence the adhesion of the copper plating film could be improved.

On the other hand, as shown in Table 2, a copper plating film was formed on the ceramic base material under the same conditions of Example 1 except that the pre-copper-plating heat treatment and the post-copper-plating heat treatment were not performed, and the tensile strength obtained when the copper plating film was separated from the ceramic base material was measured under the same conditions as those in the Sebastian method. In addition, the tensile strength of a copper plating film which was only processed by the pre-copper-plating heat treatment at 450° C. for 2 hours and the tensile strength of a copper plating film which was only processed by the post-copper-plating heat treatment at 450° C. for 7 hours were also measured.

TABLE 1

Evaluation of Adhesion: Unit (MPa)

| Pre-Copper-Plating Heat Treatment Step | | Post-Copper-Plating Heat Treatment Step | | Evaluation | Nickel Concentration (Mol/L) | | | | |
|---|---|---|---|---|---|---|---|---|---|
| Time | Temperature | Time | Temperature | Surface | 0 | 0.0004 | 0.0023 | 0.0039 | 0.01 |
| 10 min. to 2 hours | 450° C. | 10 min. to 2 hours | 450° C. | First surface | 0 | 52-55 | 52-68 | 55-62 | 50-61 |
| | | | | Second surface | 3 | 33-34 | 33-40 | 35-40 | 35-45 |
| 10 min. to 2 hours | 450° C. | 10 min. to 2 hours | 350° C. | First surface | 0 | 52-54 | 53-61 | 55-60 | 50-60 |
| | | | | Second surface | 2 | 55-60 | 60-61 | 55-60 | 50-60 |
| 10 min. to 2 hours | 450° C. | 10 min. to 2 hours | 250° C. | First surface | 0 | 40-54 | 49-58 | 55-60 | 55-60 |
| | | | | Second surface | 2 | 30-31 | 30-31 | 30-31 | 30-35 |
| 10 min. to 2 hours | 350° C. | 10 min. to 2 hours | 450° C. | First surface | 0 | 35-54 | 35-72 | 45-60 | 50-60 |
| | | | | Second surface | 2 | 40-51 | 40-62 | 40-60 | 40-60 |
| 10 min. to 2 hours | 350° C. | 10 min. to 2 hours | 350° C. | First surface | 0 | 50-54 | 59-74 | 60-64 | 50-60 |
| | | | | Second surface | 2 | 20-32 | 30-32 | 30-50 | 30-50 |
| 10 min. to 2 hours | 350° C. | 10 min. to 2 hours | 250° C. | First surface | 0 | 45-54 | 45-60 | 60-64 | 50-60 |
| | | | | Second surface | 1 | 30-32 | 27-55 | 30-55 | 30-60 |
| 10 min. to 2 hours | 250° C. | 10 min. to 2 hours | 450° C. | First surface | 0 | 50-54 | 53-57 | 55-64 | 50-60 |
| | | | | Second surface | 2 | 30-45 | 28-55 | 30-55 | 30-60 |
| 10 min. to 2 hours | 250° C. | 10 min. to 2 hours | 350° C. | First surface | 0 | 50-60 | 61-63 | 60-64 | 50-60 |
| | | | | Second surface | 2 | 45-50 | 46-62 | 50-55 | 50-60 |
| 10 min. to 2 hours | 250° C. | 10 min. to 2 hours | 250° C. | First surface | 0 | 50 | 55-73 | 60-65 | 40-60 |
| | | | | Second surface | 2 | 28-40 | 28-42 | 30-45 | 30-50 |

TABLE 2

Evaluation of Adhesion: Unit (MPa)

| Pre-Copper-Plating Heat Treatment Step | | Post-Copper-Plating Heat Treatment Step | | Evaluation | Nickel Concentration (Mol/L) | | | | |
|---|---|---|---|---|---|---|---|---|---|
| Time | Temperature | Time | Temperature | Surface | 0 | 0.0004 | 0.0023 | 0.0039 | 0.01 |
| — | — | — | — | First surface | 0 | 0 | 0 | 0 | 0 |
|  |  |  |  | Second surface | 0 | 0 | 0 | 0 | 0 |
| 2 hours | 450° C. | — | — | First surface | 0 | 0 | 0 | 0 | 0-5 |
|  |  |  |  | Second surface | 0 | 11 | 18 | 20 | 10-20 |
| — | — | 7 hours | 450° C. | First surface | 0 | 0 | 0 | 0 | 0-10 |
|  |  |  |  | Second surface | 1 | 19 | 20 | 23 | 0-25 |

As shown in Table 2, in the case in which the pre-copper-plating heat treatment and the post-copper-plating heat treatment were not performed, the adhesion between the copper plating film and the ceramic base material could not be ensured at both first and second surface sides. In addition, in the cases in which one of the pre-copper-plating heat treatment and the post-copper-plating heat treatment was performed, the adhesion between the copper plating film and the ceramic base material could not be ensured at the first surface side. Furthermore, at the second surface side, although the adhesion between the copper plating film and the ceramic base material could be ensured, the tensile strength was approximately 20 MPa or less, and as a result, the copper plating film was easily peeled away from the ceramic base material.

Example 2

Approximately 50% of a borosilicate glass and approximately 50% of a fine alumina powder were mixed to form a ceramic base material containing a glass component, and the ceramic base material thus formed was degreased and washed.

Next, after being applied onto a first and a second surface of the ceramic base material, a resist solution was processed by exposure and development using a predetermined mask so as to form resists having a predetermined pattern, followed by sufficient washing with water.

Subsequently, the ceramic base material was immersed in the aqueous tin chloride solution described in the circuit forming method using the electroless plating method of the first embodiment for 3 minutes, followed by sufficient washing with water. In addition, the ceramic base material thus washed was then immersed in the aqueous palladium chloride solution described in the first embodiment for 2 minutes.

Furthermore, the ceramic base material was again immersed in the above aqueous tin chloride solution for 2 minutes and was then immersed in the above aqueous palladium chloride solution for 1 minute, followed by sufficient washing with water. Next, the resists were removed, so that catalyst layers having a predetermined pattern were formed.

Subsequently, after the ceramic base material was sufficiently washed with water, followed by drying, pre-copper-plating heat treatment was performed for the ceramic base material at 450° C. for 30 minutes in the air.

Next, after sufficiently washed with water, the ceramic base material was immersed in the aqueous formalin solution of the first embodiment for 1 minute to reduce the catalyst layers, and without performing washing with water, plating treatment was then performed.

In Example 2, a copper plating solution was prepared which contained copper ions at a concentration of 2.5 g/L (0.039 mol/L), nickel ions at a concentration of 0.14 g/L (0.0024 mol/L), potassium sodium tartrate tetrahydrate, approximately 0.2% of formaldehyde ($CH_2O$), approximately 1.5 g/L of sodium hydroxide (NaOH), and approximately 0.1% of a chelating agent.

Next, the ceramic base material was immersed in the above copper plating solution at 36° C. to form green copper plating films having a thickness of 2 μm and was then sufficiently washed, followed by drying.

Subsequently, post-copper-plating heat treatment was performed at 350° C. for 30 minutes in a nitrogen atmosphere for the ceramic base material, so that copper plating films were formed thereon.

Furthermore, after being sufficiently washed and was then dried, the ceramic base material was immersed in a palladium solution at 30° C. for 1 minute for catalyst treatment, and then washing was performed with purified water.

Next, the ceramic base material was immersed in an electroless nickel-phosphorus plating solution at 80° C. for 20 minutes to form nickel plating films having a thickness of 2 μm and was then immersed in a gold plating solution at 60° C. for 10 minutes to form gold plating films having a thickness of 0.05 μm. Subsequently, post-nickel-plating heat treatment was performed at 350° C. for 1 hour in a nitrogen atmosphere, so that circuits were formed on the ceramic base material.

The tensile strengths of the nickel plating film and the gold plating film were 64 MPa, and hence the adhesion could be improved. The resistivity of the copper plating film was approximately 2.5 to 5 μΩ·cm, and hence circuits having superior high frequency properties could be formed.

Furthermore, when circuits were formed on a silicon base material provided with silicon oxide films thereon by the circuit forming method of Example 2, the tensile strengths of the nickel plating film and the gold plating film were 50 MPa or more, and hence the adhesion could be improved. In addition, the resistivity of the copper plating film was approximately 2.5 to 5 μΩ·cm, and hence circuits having superior high frequency properties could be formed.

Example 3

Ceramic base materials containing a glass component, which were each formed of approximately 50% of a borosilicate glass and approximately 50% of a fine alumina powder and which were each provided with Ag-based vias therein, were degreased and washed using a degreasing agent containing sodium hydroxide, a carbonate, a phosphate, and the like.

Subsequently, ceramic base materials were immersed in the aqueous tin chloride solution described in the second embodiment at 23° C. for 3 minutes, followed by sufficient washing with water. In addition, the ceramic base materials thus washed were then immersed in the aqueous palladium chloride solution described in the second embodiment at 30° C. for 2 minutes. Furthermore, the ceramic base materials were again immersed in the above aqueous tin chloride solution for 2 minutes and were then immersed in the above aqueous palladium chloride solution for 1 minute to form catalyst layers, followed by sufficient washing with water and drying.

Subsequently, pre-copper-plating heat treatment was performed for the ceramic base materials at heat treatment temperatures of 250 and 450° C. for a heat treatment time in the range of 10 minutes to 2 hours in a nitrogen atmosphere, so that copper plating films were formed on the ceramic base materials.

The adhesion of the copper plating films to Ag layers of the vias was measured, the copper plating films being formed as described above by changing the amount of nickel ions in the copper plating solution of the plating treatment, and by changing the heat treatment temperatures and times in the pre-copper-plating heat treatment and in the post-copper-plating heat treatment.

For the adhesion evaluation, by the Sebastian method equivalent to that described in Example 1, the tensile strengths (MPa) were measured at which the copper plating film was separated from the Ag layer at both first surface and second surface sides of the ceramic base material, the second surface being rougher than the first surface.

TABLE 3

Adhesion of Copper Plating Film on Ag Via
Evaluation of Adhesion: Unit (MPa)

| Pre-Copper-Plating Heat Treatment Step | | Post-Copper-Plating Heat Treatment Step | | Evaluation | Nickel Concentration (Mol/L) | | | | |
| --- | --- | --- | --- | --- | --- | --- | --- | --- | --- |
| Time | Temperature | Time | Temperature | Surface | 0 | 0.0004 | 0.0023 | 0.0039 | 0.01 |
| 10 min. to 2 hours | 450° C. | 10 min. to 2 hours | 450° C. | First surface | 0 | 30-67 | 52-73 | 55-70 | 50-60 |
| | | | | Second surface | 0 | 33-34 | 50-67 | 55-73 | 50-65 |
| 10 min. to 2 hours | 250° C. | 10 min. to 2 hours | 250° C. | First surface | 0 | 10-20 | 22-37 | 23-40 | 20-40 |
| | | | | Second surface | 0 | 15-30 | 28-42 | 30-40 | 30-40 | temperatures of 250 and 450° C. for a heat treatment time in the range of 10 minutes to 2 hours in the air.

Next, after the pre-copper-plating treatment step, oxide film removing treatment was performed for 1 minute using an aqueous $H_2O_2$ solution at a concentration of 3% at room temperature, followed by sufficient washing with water. The ceramic base materials thus processed were immersed in the aqueous formalin solution of the second embodiment for 1 minute so as to reduce the catalyst layers.

In Example 3, a copper plating solution was prepared which contained copper ions at a concentration of 2.5 g/L (0.039 mol/L), potassium sodium tartrate tetrahydrate, approximately 0.2% of formaldehyde ($CH_2O$), approximately 1.5 g/L of sodium hydroxide (NaOH), and approximately 0.1% of a chelating agent. By using the copper plating solution described above as a fundamental composition, as shown in Table 3, 5 types of copper plating solutions were prepared, that is, solutions containing nickel ions at a concentration of 0.00039, 0.0023, 0.0039, 0.01, and 0 moles/L were prepared.

Next, the ceramic base materials formed as described above were immersed in the respective copper plating solutions at 36° C. to form green copper plating films having a thickness of 2 μm and were then sufficiently washed with water, followed by drying.

Furthermore, as shown in Table 3, post-copper-plating heat treatment was performed at heat treatment temperatures of 250 and 450° C. for a heat treatment time in the range of As shown in Table 3, when the copper plating solutions having a nickel ion concentration of 0.00039 to 0.01 mole/L were used, at both first and second surface sides of the ceramic base material, the tensile strengths were approximately 30 MPa or more; hence, the adhesion of the copper plating film could be improved so that the Ag layer was broken or so that the bonding portion between the evaluation pin and the plating film was broken. Hence, separation was not observed at the interface between the catalyst layer and the copper plating film and the interface between the catalyst layer and the Ag layer. On the other hand, when the copper plating solution containing no nickel ions was used, the adhesion between the copper plating film and the Ag layer could hardly be ensured.

On the other hand, as shown in Table 4, a copper plating film was formed as a comparative example under the same conditions as those of Example 3 except that the pre-copper-plating heat treatment and the post-copper-plating heat treatment were not performed, and the tensile strength obtained when the copper plating film was separated from the Ag layer was measured under the same conditions as those in the Sebastian method. In addition, the tensile strength of a copper plating film which was only processed by the pre-copper-plating heat treatment at 450° C. for 2 hours and the tensile strength of a copper plating film which was only processed by the post-copper-plating heat treatment at 450° C. for 7 hours were also measured.

TABLE 4

Evaluation of Adhesion: Unit (MPa)

| Pre-Copper-Plating Heat Treatment Step | | Post-Copper-Plating Heat Treatment Step | | Evaluation | Nickel Concentration (Mol/L) | | | | |
|---|---|---|---|---|---|---|---|---|---|
| Time | Temperature | Time | Temperature | Surface | 0 | 0.0004 | 0.0023 | 0.0039 | 0.01 |
| — | — | — | — | First surface | 0 | 0 | 0 | 0 | 0 |
| — | — | — | — | Second surface | 0 | 0 | 0 | 0 | 0 |
| 2 hours | 450° C. | — | — | First surface | 0 | 1 | 1 | 1 | 0-5 |
| | | | | Second surface | 0 | 1 | 1 | 2 | 0-5 |
| — | — | 7 hours | 450° C. | First surface | 0 | 45 | 60 | 65 | 50-60 |
| | | | | Second surface | 0 | 50 | 60 | 65 | 50-60 |

As shown in Table 4, in the case in which the pre-copper-plating heat treatment and the post-copper-plating heat treatment were not performed, the adhesion between the copper plating film and the Ag layers formed at the first surface and the second surface sides of the ceramic base material could not be ensured. In addition, in the case in which the pre-copper-plating heat treatment was only performed, the adhesion between the Ag layer and the copper plating film could not be ensured at both first and second surfaces. On the other hand, in the case in which the post-copper-plating heat treatment was only performed, when the copper plating films were formed using the copper plating solution having a concentration of 0.00039 to 0.01 mol/L, the tensile strengths of the Ag layer at both first and second surface sides of the ceramic base material were also increased to 45 MPa or more, and hence the adhesion of the copper plating film was improved.

Example 4

A ceramic base material containing a glass component, which was formed of approximately 50% of a borosilicate glass and approximately 50% of a fine alumina powder and which was provided with Ag-based vias therein, was degreased and washed.

Next, after a resist solution was applied onto first and the second surfaces of the base material and was then processed by exposure and development to form resists each having a predetermined pattern, washing was sufficiently performed with water.

Subsequently, the ceramic base material was immersed for 3 minutes in the aqueous tin chloride solution described in the circuit forming method using the electroless plating method of the second embodiment, followed by sufficient washing with water. In addition, the ceramic base material thus washed was then immersed for 2 minutes in the aqueous palladium chloride solution described in the second embodiment.

Furthermore, the ceramic base material was again immersed in the above aqueous tin chloride solution for 2 minutes and was then immersed in the above aqueous palladium chloride solution for 1 minute, followed by sufficient washing with water. Next, the resists were removed, so that catalyst layers having a predetermined pattern were formed.

Subsequently, after the ceramic base material was sufficiently washed with water and then dried, pre-copper-plating heat treatment step was performed at a heat treatment temperature of 450° C. for a heat treatment time of 30 minutes in the air.

Next, after the pre-copper-plating treatment step, oxide film removing treatment was performed for 1 minute at room temperature using an aqueous $H_2O_2$ solution at a concentration of 3%, followed by sufficient washing with water. The ceramic base material thus processed was immersed for 1 minute in the aqueous formalin solution of the second embodiment so as to reduce the catalyst layers and was then processed by plating treatment without performing water washing.

In Example 4, a copper plating solution was prepared which contained copper ions at a concentration of 2.5 g/L (0.039 mol/L), nickel ions at a concentration of 0.14 g/L (0.0024 mol/L), potassium sodium tartrate tetrahydrate, approximately 0.2% of formaldehyde, approximately 1.5 g/L of sodium hydroxide (NaOH), and approximately 0.1% of a chelating agent.

Next, the ceramic base material was immersed in the above copper plating solution at 36° C. to form green copper plating films having a thickness of 2 μm and was then sufficiently washed with water, followed by drying.

Subsequently, post-copper-plating heat treatment was performed at a heat treatment temperature of 350° C. for a heat treatment time of 30 minutes in a nitrogen atmosphere, so that copper plating films were formed on the ceramic base material.

Furthermore, on the copper plating films, nickel plating films having a thickness of 2 μm were formed by an electroless nickel plating method, and by an electroless gold plating method, gold plating films having a thickness of 0.05 μm were further formed on the nickel plating films, so that circuits were formed on the ceramic base material.

In the circuits thus formed, the resistivity of the copper plating film was approximately 2.5 to 5 μΩ·cm, and hence a circuit having superior high frequency properties could be formed.

Example 5

A sapphire base material was used as the base material and was degreased and washed at 50° C. for 3 minutes using a sodium hydroxide solution at a concentration of 15%.

Next, the base material was immersed for 3 minutes in a hydrochloric aqueous tin chloride solution containing 0.005 mol/L of tin chloride and was then sufficiently washed with water. In addition, the base material thus washed was immersed for 2 minutes in an aqueous palladium chloride solution at a concentration of 0.003 mol/L at 30° C. and was then sufficiently washed with water, followed by drying.

Furthermore, pre-copper-plating heat treatment was performed at a heat treatment temperature of 400° C. for a heat treatment time of 1 hour in the air.

After the pre-copper-plating treatment step, the base material was again immersed in an aqueous hydrochloric tin chloride solution equivalent to that described in the above catalyst treatment step for 3 minutes, sufficient washing was performed with water. Subsequently, the base material was immersed in an aqueous palladium chloride solution at a concentration of 0.003 mol/L at 30° C. for 2 minutes so as to form catalyst layers and was then sufficiently washed with water, followed by drying.

Next, after the base material was immersed in the aqueous formalin solution described in the first embodiment for 1 minute so as to reduce the catalyst layers, copper plating treatment was performed without performing water washing.

In this example, a copper plating solution was prepared which contained copper ions at a concentration of 2.5 g/L (0.039 mol/L), nickel ions at a concentration of 0.138 g/L (0.0023 mol/L), potassium sodium tartrate tetrahydrate (Rochelle salt) used as a complexing agent, approximately 0.2% of formaldehyde used as a reducing agent, and approximately 0.1% of a chelating agent, in which the pH was adjusted to be approximately 12.6. Next, the base material was immersed in the above copper plating solution to form green copper plating films having a thickness of approximately 1 μm and was then sufficiently washed with water, followed by drying.

Furthermore, post-copper-plating heat treatment was performed at a heat treatment temperature of 150° C. for 1 hour in a nitrogen atmosphere for the sapphire base material while a pressure of 1 kg/cm² was being applied thereto.

A copper plating film thus formed on the sapphire base material had a tensile strength of 40 MPa or more when a predetermined pressure was applied in the post-copper-plating heat treatment step performed at a temperature of 150° C., and hence the adhesion of the copper plating film could be improved. On the other hand, when the pressure was not applied, the adhesion between the copper plating film and the sapphire base material could hardly be ensured.

Example 6

Glass base materials formed of a borosilicate glass were polished to form mirror-finished surfaces and were then degreased and washed.

Next, after being immersed in the aqueous tin chloride solution of the third embodiment for 3 minutes and then sufficiently washed with water, the glass base materials were immersed in the aqueous palladium chloride solution described in the third embodiment for 2 minutes.

Furthermore, after being immersed in the above aqueous tin chloride solution for 2 minutes, the glass base materials were immersed in the aqueous palladium chloride solution described in the third embodiment for 1 minute to form catalyst layers, followed by sufficient washing with water. Next, the glass base materials were immersed in the aqueous formalin solution of the third embodiment for 1 minute to reduce the catalyst layers.

Next, in this example, a copper plating solution was prepared which contained copper ions at a concentration of 2.5 g/L (0.039 mol/L), potassium sodium tartrate tetrahydrate, approximately 0.2% of formaldehyde, approximately 1.5 g/L of sodium hydroxide (NaOH), and approximately 0.1% of a chelating agent. By using the copper plating solution described above as a fundamental composition, as shown in Table 5, 5 types of copper plating solutions were prepared, that is, solutions containing nickel ions at a concentration of 0.00039, 0.0023, 0.0039, 0.01, and 0 moles/L were prepared.

Next, the ceramic base materials were immersed in the respective copper plating solutions to form green copper plating films having a thickness of 2 μm and were then sufficiently washed with water, followed by drying.

Furthermore, as shown in Table 5, heat treatment was performed at various heat treatment temperatures in the range of 150 to 450° C. for various heat treatment times in the range of 10 to 120 minutes in a nitrogen atmosphere, so that copper plating films were formed on the glass base materials.

The adhesion of the copper plating films to the glass substrates was measured, the copper plating films being formed as described above by changing the amount of nickel ions in the copper plating solution of the plating treatment, and by changing the heat treatment temperatures and times in the heat treatment.

For the adhesion evaluation, a tensile test was performed under the same conditions as those of the Sebastian method of Example 1, and the tensile strengths (MPa) were measured when the copper plating films were separated from the glass base materials.

TABLE 5

Evaluation of Adhesion: Unit (MPa)

| Heat Treatment Time (min) | Heat Treatment Temperature (° C.) | Nickel Concentration (mol/L) | | | | |
|---|---|---|---|---|---|---|
| | | 0 | 0.00039 | 0.0023 | 0.0039 | 0.01 |
| 0 | — | 0 | 0 | 0 | 0 | 0 |
| 10 | 450 | 1 | 50 | 59 | 70 | 50-60 |
| 120 | 450 | 2 | 52 | 60 | 65 | 50-65 |
| 10 | 350 | 1 | 48 | 59 | 62 | 50-60 |
| 120 | 350 | 1 | 55 | 58 | 59 | 50-65 |
| 10 | 250 | 0 | 50 | 55 | 56 | 50-55 |
| 120 | 250 | 0 | 48 | 55 | 50 | 50-60 |
| 120 | 150 | 0 | 9 | 8 | 7 | 0-10 |

As shown in Table 5, when the copper plating solutions having a nickel ion concentration of 0.00039 to 0.01 mole/L were used for forming the copper plating films, the adhesion of the copper plating film to the glass base material could be improved so that the glass base material was broken or so that the bonding portion between the evaluation pin and the copper plating film was broken. As described above, separation was not observed at the interface between the catalyst layer and the copper plating film and at the interface between the catalyst layer and the glass base material, and hence a significantly superior adhesion was obtained between the glass base material and the copper plating film.

In the case in which the heat treatment was performed for more than 120 minutes, which is out of the range of the heat treatment time described above, the adhesion between the glass base material and the copper plating film was not so much changed from that obtained when the heat treatment was performed for approximately 120 minutes.

On the other hand, when the copper plating solution containing no nickel ions was used, the adhesion between the copper plating film and the glass base material could hardly be ensured, and in addition, when the heat treatment was not performed after the formation of the copper plating film, the copper plating film was very easily separated from the catalyst layer at the interface therebetween.

Example 7

A glass base material formed of a borosilicate glass was polished so as to have mirror-finished surfaces and was then degreased and washed.

Next, after a photoresist solution was applied onto surfaces of the glass base material and was then processed by exposure and development to form resists each having a predetermined pattern, washing was sufficiently performed with water.

Subsequently, the glass base material was immersed for 3 minutes in the aqueous tin chloride solution described in the circuit forming method using the electroless plating method of the third embodiment, followed by sufficient washing with water. In addition, the glass base material thus washed was then immersed for 2 minutes in the aqueous palladium chloride solution described in the third embodiment.

Furthermore, the glass base material was again immersed in the above aqueous tin chloride solution for 2 minutes and was then immersed in the above aqueous palladium chloride solution for 1 minute, followed by sufficient washing with water. Next, the resists were removed, so that catalyst layers having a predetermined pattern were formed.

Subsequently, after being sufficiently washed with water, the glass base material was immersed in the aqueous formalin solution described in the third embodiment for 1 minute to reduce the catalyst layers and was then processed by plating treatment without performing water washing.

In Example 7, a copper plating solution was prepared which contained copper ions at a concentration of 2.5 g/L (0.039 mol/L), nickel ions at a concentration of 0.14 g/L (0.0024 mol/L), potassium sodium tartrate tetrahydrate, approximately 0.2% of formaldehyde, approximately 1.5 g/L of sodium hydroxide (NaOH), and approximately 0.1% of a chelating agent.

Next, the glass base material was immersed in the above copper plating solution at 36° C. to form green copper plating films having a thickness of 2 μm and was then sufficiently washed with water, followed by drying.

Subsequently, post-copper-plating heat treatment was performed for the glass base material at a heat treatment temperature of 450° C. for a heat treatment time of 60 minutes in a nitrogen atmosphere, so that copper plating films were formed on the glass base material.

Furthermore, after being sufficiently washed with water and was then dried, the glass base material was immersed in a palladium solution at 30° C. for 1 minute for catalyst treatment, and washing was then performed with purified water.

Next, after being immersed in an electroless nickel-phosphorus plating solution at 80° C. for 20 minutes to form nickel plating films having a thickness of 2 μm, the glass base material was immersed in a gold plating solution at 60° C. for 10 minutes to form gold plating films having a thickness of 0.05 μm on the nickel plating films. Subsequently, post-nickel-plating heat treatment was performed at a heat treatment temperature of 350° C. for a heat treatment time of 1 hour in a nitrogen atmosphere, so that circuits were formed on the glass base material.

In the circuits thus formed, the tensile strengths of the nickel plating film and the gold plating film were 60 MPa, and hence the adhesion could be improved. The resistivity of the copper plating film was approximately 2.5 to 5 μΩ·cm, and hence a circuit having superior high frequency properties could be formed.

Example 8

Glass base materials formed of a soda lime glass and a borosilicate glass were prepared as the base material and were then processed as described below. That is, the glass base materials were immersed for 3 minutes in the aqueous tin chloride solution of the circuit forming method using the electroless plating method described in the third embodiment. After sufficient washing with water, the glass base materials were immersed for 2 minutes in the aqueous palladium solution described in the third embodiment.

Furthermore, the glass base materials were again immersed in the above aqueous tin chloride solution for 2 minutes and were then immersed in the above aqueous palladium chloride solution for 1 minute, followed by sufficient washing with water.

Subsequently, the glass base materials were immersed for 1 minute in the aqueous formalin solution described in the third embodiment to reduce catalyst layers and were then processed by plating treatment without performing water washing.

In Example 8, a copper plating solution was prepared which was equivalent to that in Example 7. Next, the glass base materials were immersed in the above copper plating solution at 30° C. to form green copper plating films having a thickness of 2 μm and were then sufficiently washed with water, followed by drying.

Furthermore, post-copper-plating heat treatment was performed at a heat treatment temperature of 400° C. for a heat treatment time of 60 minutes in a nitrogen atmosphere, so that copper plating films were formed on the glass base materials.

Next, after a photoresist solution was applied onto the glass base materials and was then processed by exposure and development using a predetermined pattern, etching was performed using an iron chloride-based copper etching solution, so that the copper plating films were formed by etching to have a predetermined pattern.

In addition, the glass base materials were immersed in a palladium solution at 30° C. for 1 minute for catalyst treatment, and washing was then performed with purified water.

Subsequently, after being immersed in an electroless nickel-phosphorus plating solution at 80° C. for 20 minutes to form nickel plating films having a thickness of 2 μm, the glass base materials were immersed in a gold plating solution at 60° C. for 10 minutes to form gold plating films having a thickness of 0.05 μm on the nickel plating films. Subsequently, in a nitrogen atmosphere, post-nickel-plating heat treatment was performed at a heat treatment temperature of 350° C. for a heat treatment time of 1 hour was performed, so that circuits were formed on the glass base materials.

In the circuits thus formed on the glass base materials described above, the tensile strengths of the nickel plating film and the gold plating film were both 50 MPa or more, and hence the adhesion could be improved.

Example 9

A borosilicate glass base material, a soda lime glass base material, and a Pyrex glass base material were used as the base materials and were processed as follows. That is, the glass base materials were degreased and washed at 50° C. for 3 minutes using an aqueous sodium hydroxide at a concentration of 15%.

Next, the base materials were immersed for 3 minutes in a hydrochloric aqueous tin chloride solution containing 0.005 mol/L of tin chloride and were then sufficiently washed with water. In addition, the base materials thus washed were immersed for 2 minutes in an aqueous palladium chloride solution at a concentration of 0.003 mol/L at a temperature of 30° C. for 2 minutes to form catalyst layers and were then sufficiently washed with water, followed by drying.

Subsequently, the glass base materials were immersed in the aqueous formalin solution described in the third embodiment for 1 minute to reduce the catalyst layers and were then processed by plating treatment without performing water washing.

In this example, a copper plating solution was prepared which contained copper ions at a concentration of 2.5 g/L (0.039 mol/L), nickel ions at a concentration of 0.138 g/L (0.0023 mol/L), potassium sodium tartrate tetrahydrate (Rochelle salt) as a complexing agent, approximately 0.2% of formaldehyde as a reducing agent, and approximately 0.1% of a chelating agent, in which the pH of the copper plating solution was adjusted to be approximately 12.6. Subsequently, the base materials were immersed in the above copper plating solutions to form green copper plating films having a thickness of approximately 1 μm, followed by sufficient washing with water and drying.

Furthermore, as shown in Table 6, heat treatment was performed at various heat treatment temperatures in the range of 150 to 200° C. for 1 hour in a nitrogen atmosphere while various pressures in the range of 1 to 3 kg/cm$^2$ were applied, so that copper plating films were formed.

Adhesive forces of the copper plating films formed by changing the conditions of temperature and pressure in the heat treatment to the respective base materials were measured and were compared to each other.

For the adhesion evaluation, a tensile test was performed under the conditions equivalent to those of the Sebastian method of Example 1, and the tensile strengths (MPa) were measured when the copper plating films were separated from the glass base materials.

TABLE 6

Evaluation of Adhesion: Unit (MPa)

Borosilicate Glass (100 mm in diameter, 0.7 mm thick)

| Heat Treatment Time (min) | Heat Treatment Temperature (° C.) | Gage Pressure (kg/L) | |
|---|---|---|---|
| | | 0 | 1 |
| 120 | 200 | 0-10 | 40≦ |

Soda Lime Glass (100 mm in diameter, 0.7 mm thick)

| Heat Treatment Time (min) | Heat Treatment Temperature (° C.) | Gage Pressure (kg/L) | | |
|---|---|---|---|---|
| | | 0 | 1 | 1.5 |
| 120 | 150 | 0-10 | 40≦ | 40≦ |

Pyrex Glass (100 mm in diameter, 0.7 mm thick)

| Heat Treatment Time (min) | Heat Treatment Temperature (° C.) | Gage Pressure (kg/L) | |
|---|---|---|---|
| | | 0 | 1.5 |
| 120 | 150 | 0-10 | 40≦ |

As shown in Table 6, in the heat treatment step performed at a temperature in the range of 150 to 200° C., when a predetermined pressure was applied, the tensile strength of each base material was increased to at least 20 MPa or more, and hence the adhesion of the copper plating film could be improved. On the other hand, when the pressure was not applied, the adhesion between the copper plating film and each base material could hardly be ensured.

Example 10

A borosilicate glass base material was used as the base material and was degreased and washed at 50° C. for 3 minutes using an aqueous sodium hydroxide at a concentration of 15%.

Next, the base material was immersed for 3 minutes in a hydrochloric aqueous tin chloride solution containing 0.005 mol/L of tin chloride and was then sufficiently washed with water. In addition, the base material thus washed was immersed for 2 minutes in an aqueous palladium chloride solution having a concentration of 0.003 mol/L at a temperature of 30° C. to form catalyst layers and was then sufficiently washed with water, followed by drying.

Subsequently, the glass base material was immersed for 1 minute in the aqueous formalin solution described in the third embodiment to reduce the catalyst layers and was then processed by plating treatment without performing water washing.

In this example, a copper plating solution was prepared which contained copper ions at a concentration of 2.5 g/L (0.039 mol/L), cobalt at a concentration of 0.138 g/L (0.0023 mol/L), potassium sodium tartrate tetrahydrate (Rochelle salt) as a complexing agent, approximately 0.2% of formaldehyde as a reducing agent, and approximately 0.1% of a chelating agent, in which the pH of the copper plating solution was adjusted to be approximately 12.6. The base material was immersed in the above copper plating solution so as to form green copper plating films having a thickness of approximately 1 μm and was then sufficiently washed, followed by drying.

Furthermore, heat treatment was performed for the glass base material at a heat treatment temp of 400° C. for a heat treatment time of 1 hour in a nitrogen atmosphere.

The tensile strength of the copper plating film formed on the glass base material as described above was 40 MPa or more, and hence, the adhesion of the copper plating film could be improved.

What is claimed is:

1. A plating substrate comprising:
    a mirror-finished glass base material having at least an oxide on a surface thereof;
    a copper plating film formed using a copper plating solution containing at least one of nickel ions, cobalt ions, and iron ions at a low concentration; and
    an interlayer which is provided between the base material and the copper plating film, and in which the following components are combined
        a base material component of the base material,
        a plating film component of the copper plating film, and
        a catalyst component including tin and palladium.

* * * * *